(12) United States Patent
Braga

(10) Patent No.: US 11,507,492 B1
(45) Date of Patent: Nov. 22, 2022

(54) APPLYING A HIERARCHICAL PROOF TO FORMAL VERIFICATION BASED PATH SENSITIZATION

(71) Applicant: Cadence Design Systems, Inc., San Jose, CA (US)

(72) Inventor: Fernanda Augusta Braga, Castro Valley, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 11 days.

(21) Appl. No.: 16/551,970

(22) Filed: Aug. 27, 2019

(51) Int. Cl.
*G06F 30/398* (2020.01)
*G06F 11/36* (2006.01)

(52) U.S. Cl.
CPC ........ *G06F 11/3608* (2013.01); *G06F 30/398* (2020.01)

(58) Field of Classification Search
None
See application file for complete search history.

(56) References Cited

U.S. PATENT DOCUMENTS

| | | | |
|---|---|---|---|
| 7,441,215 B1* | 10/2008 | Sahrling | G06F 30/398 716/103 |
| 8,069,426 B2* | 11/2011 | Nequist | G06F 30/39 716/106 |
| 9,047,427 B1* | 6/2015 | Doucet | G06F 30/398 |
| 9,449,196 B1 | 9/2016 | Purri et al. | |
| 9,817,930 B1 | 11/2017 | Campos et al. | |
| 10,176,285 B1* | 1/2019 | Lundgren | G06F 30/3323 |
| 10,409,945 B1* | 9/2019 | Ip | G06F 30/392 |
| 2003/0051222 A1* | 3/2003 | Williams | G06F 30/394 716/113 |
| 2010/0281306 A1* | 11/2010 | Sinha | G06F 11/3608 714/38.1 |
| 2013/0091477 A1* | 4/2013 | Iemura | G06F 30/327 716/104 |
| 2016/0188785 A1* | 6/2016 | Drasny | G06F 30/327 716/104 |
| 2017/0053051 A1* | 2/2017 | De | G06F 30/30 |
| 2019/0286782 A1* | 9/2019 | Nalla | G06F 30/398 |

* cited by examiner

*Primary Examiner* — Jason D Mitchell
(74) *Attorney, Agent, or Firm* — Mark H. Whittenberger; Holland & Knight LLP

(57) ABSTRACT

The present disclosure relates to a method for electronic design verification. Embodiments may include identifying a plurality of higher level instances along an electronic design path from a source to a destination. Embodiments may further include analyzing inter-instance path information associated with the plurality of higher level instances included in the electronic design path from source to destination. Analyzing may include ignoring information included within the plurality of higher level instances. Embodiments may further include determining, based upon, at least in part, inter-instance path information whether data is unable to propagate from the source to the destination.

17 Claims, 28 Drawing Sheets

200

identifying a plurality of higher level instances along an electronic design path from a source to a destination

202

analyzing inter-instance path information associated with the plurality of higher level instances included in the electronic design path from source to destination, wherein analyzing includes ignoring information included within the plurality of higher level instances

204

determining, based upon, at least in part, inter-instance path information whether data is unable to propagate from the source to the destination

APPLYING A HIERARCHICAL PROOF TO FORMAL VERIFICATION BASED PATH SENSITIZATION

FIELD OF THE INVENTION

The present disclosure relates to electronic design verification, and more specifically, to a method for applying a hierarchical proof to an electronic design path.

DISCUSSION OF THE RELATED ART

In electronic designs, path sensitization properties in formal verification can be very challenging to converge due to the intrinsic complexity of path sensitization technology. This is an issue for verification applications (such as the Security Path Verification "SPV" application available from the Assignee of the present disclosure), which are typically applied at larger designs (subsystems, System-on-a-chip "SoC", etc.) where security requirements are described but formal verification's exhaustiveness may not scale well, causing state space explosion and performance issues. The need for a good solution is further necessitated by the criticality of security checks, and the customer's expectation to prove their code is 100% secure, which may never be achieved in simulation.

This is also an issue for X-Propagation ("XPROP") applications and although it is recommended for certain designs, occasionally users want to run an XPROP application on bigger designs or struggle with convergence in smaller designs due to the number of X-Propagation properties automatically generated. XPROP runs usually generate 100s or 1000s of properties (each property concerning a target/destination where an X is not expected to be seen) and another 100s or 1000s of possible X sources.

Summary of Disclosure

In one or more embodiments of the present disclosure, a computer-implemented method for electronic design verification is provided. The method may include identifying a plurality of higher level instances along an electronic design path from a source to a destination. The method may further include analyzing inter-instance path information associated with the plurality of higher level instances included in the electronic design path from source to destination. Analyzing may include ignoring information included within the plurality of higher level instances. The method may further include determining, based upon, at least in part, inter-instance path information whether data is unable to propagate from the source to the destination.

One or more of the following features may be included. In some embodiments, determining may include determining whether information is able to propagate through a portion of the electronic design path. Determining may further include determining whether information is unable to propagate through a portion of the electronic design path. Determining may also include reporting a particular instance that allows the data to propagate. Determining may further include reporting a particular instance that does not allow the data to propagate. The method may also include attempting to prove the validity of a subportion of the electronic design path. The method may include automatically determining one or more instances that do not hide a functional path or one or more instances that do hide a functional path. The method may also include abstracting logic included within the plurality of higher level instances. The method may further include generating a report including the one or more instances. The method may also include analyzing check data propagation associated with associated with one or more design black-boxes.

In one or more embodiments of the present disclosure a computer-readable storage medium having stored thereon instructions, which when executed by a processor result in one or more operations is provided. Operations may include identifying a one or more higher level instances along an electronic design path and analyzing inter-instance path information associated with the one or more higher level instances included in the electronic design path, wherein analyzing includes ignoring information included within at least one of the one or more higher level instances. Operations may further include determining, based upon, at least in part, inter-instance path information whether data is unable to propagate from the source to the destination along a specified portion of the electronic design path.

One or more of the following features may be included. In some embodiments, determining may include determining whether information is able to propagate through a portion of the electronic design path. Determining may further include determining whether information is unable to propagate through a portion of the electronic design path. Determining may also include reporting a particular instance that allows the data to propagate. Determining may further include reporting a particular instance that does not allow the data to propagate. Operations may also include attempting to prove the validity of a subportion of the electronic design path. Operations may include automatically determining one or more instances that do not hide a functional path or one or more instances that do hide a functional path. Operations may also include abstracting logic included within the plurality of higher level instances. Operations may further include generating a report including the one or more instances. Operations may also include analyzing check data propagation associated with one or more design black-boxes.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure. The patent or application file contains at least one drawing executed in color. Copies of this patent or patent application publication with color drawing(s) will be provided by the Office upon request and payment of the necessary fee.

FIG. 2 is a flowchart depicting operations consistent with the verification process in accordance with an embodiment of the present disclosure;

DETAILED DESCRIPTION

Figure 1:
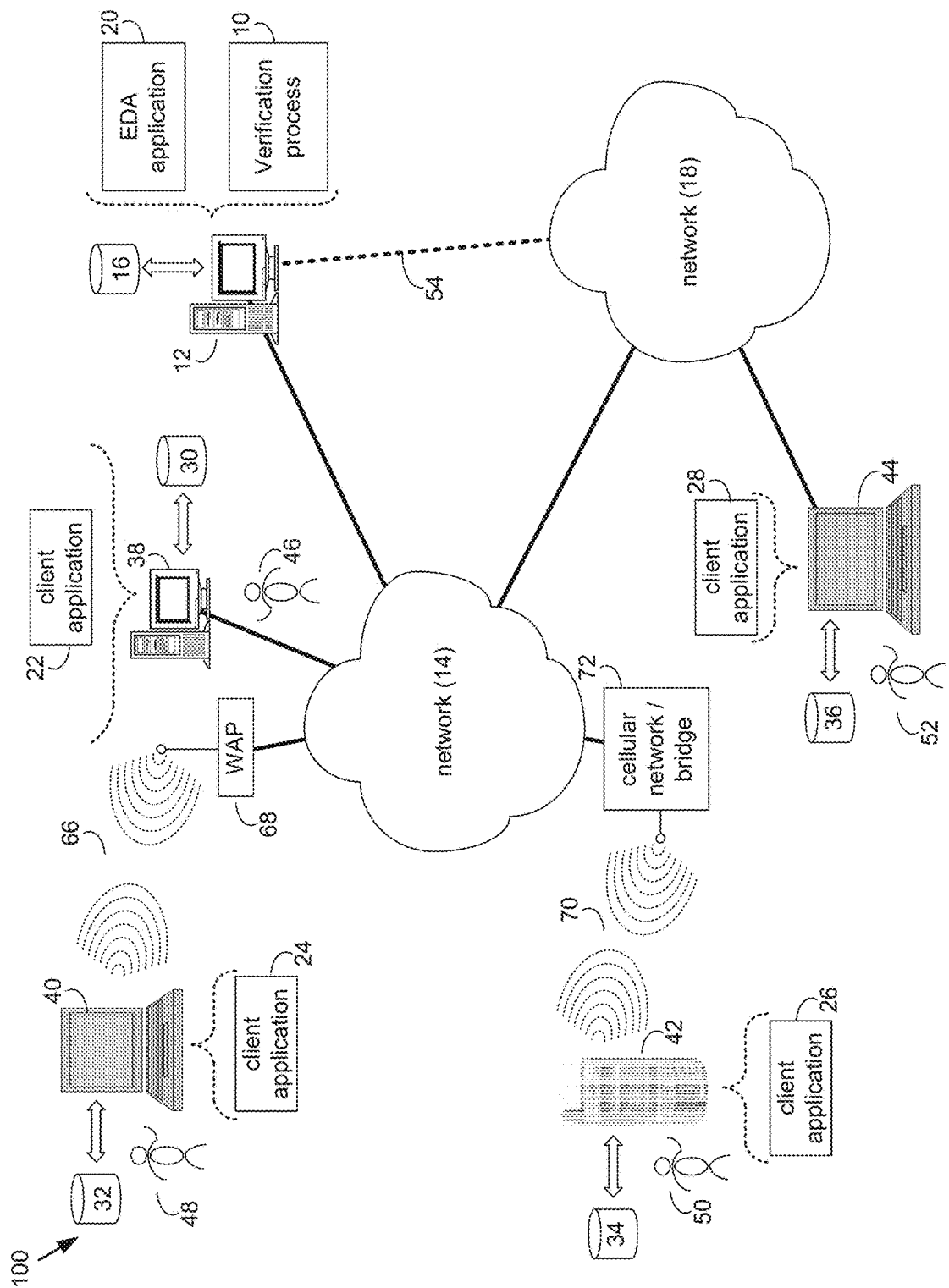
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a diagram 100 including a verification process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, verification process 10 may reside on and be executed, in whole or in part, by a client electronic device, such as a personal computer, notebook computer, personal digital assistant, or the like.

The instruction sets and subroutines of verification process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization and/or verification.

Verification process 10 may be a stand-alone application, or may be an applet/application/script that may interact with and/or be executed within EDA application 20. In addition/ as an alternative to being a server-side process, verification process 10 may be a client-side process (not shown) that may reside on a client electronic device (described below) and may interact with an EDA client application (e.g., one or more of EDA client applications 22, 24, 26, 28). Further, verification process 10 may be a hybrid server-side/client-side process that may interact with EDA application 20 and an EDA client application (e.g., one or more of client applications 22, 24, 26, 28). As such, verification process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize verification process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Referring now to FIG. 2, an exemplary flowchart 200 depicting operations consistent with verification process 10 is provided. Operations may include identifying (202) a plurality of higher level instances along an electronic design path from a source to a destination and analyzing (204) inter-instance path information associated with the plurality of higher level instances included in the electronic design path from source to destination, wherein analyzing includes ignoring information included within the plurality of higher level instances. Operations may further include determining (206), based upon, at least in part, inter-instance path information whether data is unable to propagate from the source to the destination.

Embodiments of the present disclosure may include subject matter provided in U.S. Pat. Nos. 9,449,196 and 9,817,930, which are each incorporated by reference herein in their entirety. These applications include material relevant to security data path validation and graph-based proof strategies, which are each discussed in further detail below.

In some embodiments, in order to make verification applications scale better for larger designs or high volume of properties, embodiments included herein may perform a hierarchical formal proof. In this approach, the process may automatically start analyzing the data propagation problem at a more abstract level using design hierarchy to guide abstraction steps. In operation, the strategy starts by analyzing less logic from the design and including more logic into the analysis as required using a top-down approach. Using this approach, intermediate iterations of the proof may be sufficient to prove the main data propagation property by induction without the need to analyze all the logic between source and destination signals.

Existing systems use a graph-based proof strategy such as that discussed in U.S. Pat. No. 9,817,930, which includes multiple strategies such as forward, backward, and parallel approaches. The forward and backward approaches both create helper assertions to attempt to locate a subset of data from source/destination signal cannot propagate to/from, such that this subset configures an "unreachable barrier" and proves the main property by induction. The parallel approach may create helper asserts to all intermediate nodes which, combined with state swarm bug hunting strategy, may assist in finding a counterexample (CEX) if one exists.

There are problems with these strategies. The first being that they have a very low granularity. The graph may include all of the signals from all of the structural paths that connect source and destination signals. In most cases, these intermediate signals are too large in number and cause considerable overhead from the time spent processing them all at once or the time needed process them one fanout/fanin barrier at a time. This overhead makes them most of the time less efficient than running the proof on the original property. Additionally, even if the granularity was not as low (e.g., only flops from structural paths are displayed, not all wires), the strategies that could find a proof more easily rely on hoping that an unreachable barrier will be either close to the source signal or close to the destination signal, which does not happen often. And so these strategies spend valuable time processing all graph signals one fanout/fanin barrier at a time, stopping and restarting the proof each time. Moreover, none of these strategies attempt to abstract logic. The forward and backward graph strategies create helper properties to signals incrementally further away from the source/destination, meaning that progressively the properties become more complex. If an unreachable barrier is not found, a considerable amount of time may be spent in trying to prove helper properties with complexity comparable to that of the original property.

Accordingly, embodiments of the present disclosure may provide a hierarchical proof strategy that may be configured to work in iterations. Each one concerning instances from a given hierarchical level. The proof strategy may stop if an "unreachable barrier" is found or if all instances have been explored. For an iteration at a given hierarchical level, all instances from this level may be considered as if they were "blackboxed" (e.g., their inner logic may be abstracted from the problem). As such, helper properties may be created to check data propagation between instances—referred to as "inter-instance path".

In operation, the proof may start at the first level instances (e.g., instances right under the top instance). Once the helper properties for inter-instance paths are created and determined, the strategy processes the results to decide which checks to perform in the next iteration. Proven inter-instance paths (e.g., data does not propagate through inter-instance path) may indicate that there is no need to go deeper into the associated instance in the next iteration, and so the "black-box" on that instance can remain for the next iterations to simplify the proof. Inter-instance paths with CEX (e.g., data propagates through path) may indicate that the strategy must explore what is inside the instance, and so the "black-box" must be removed from the associated instance to reveal logic inside. In the next proof iteration, the exposed second level instances inside may be "black-boxed". New helper properties to check inter-instance paths may be created, and so on. If during an iteration an instance has no sub-instances, then paths from that instance's input and inout ports to that instance's own output and inout ports may be created, which may be referred to as "intra-instance paths".

In some embodiments, at the end of each proof iteration, the strategy checks if the proven inter/intra-instance paths are enough to configure an "unreachable barrier". For example, source data cannot propagate through paths not going through proven paths, proving the main property by induction.

Figure 3:
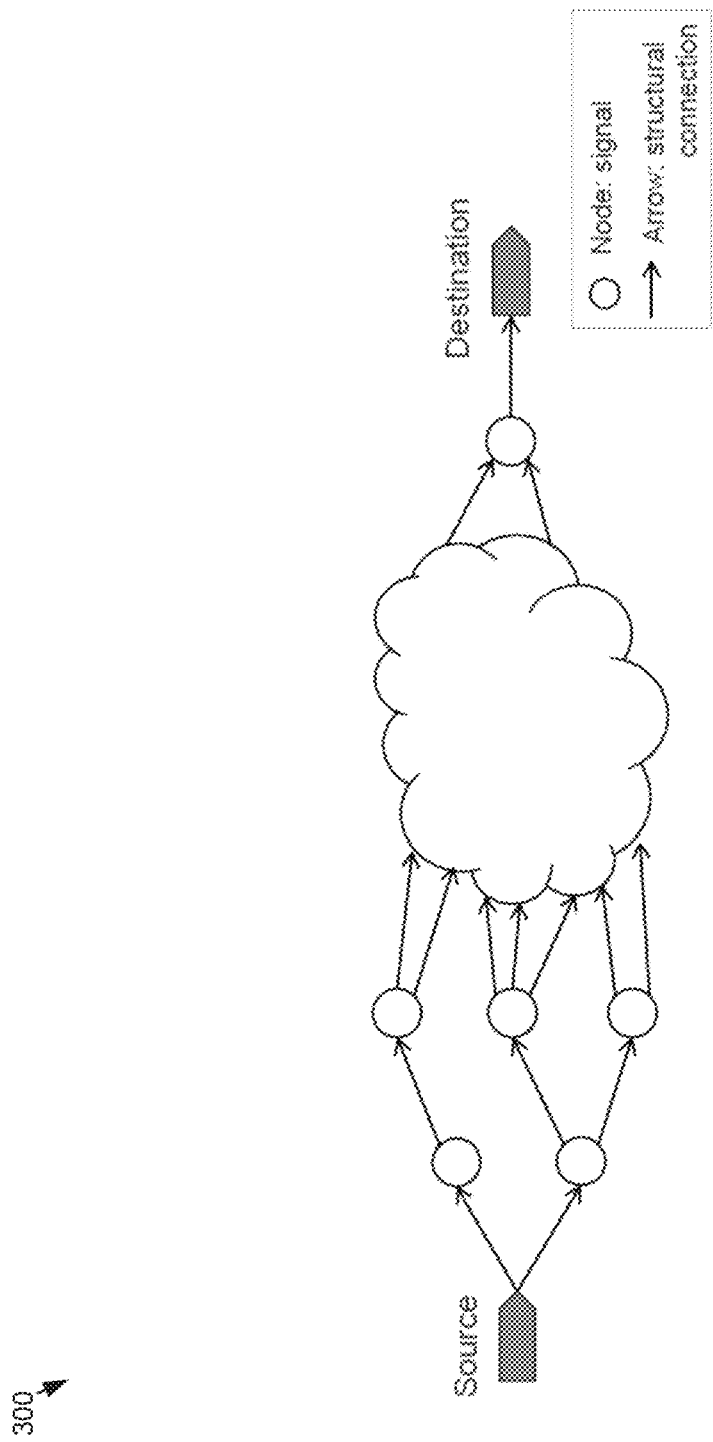
FIG. 3 is a diagram depicting an example consistent with embodiments of the present disclosure.

Referring now to FIG. 3, a diagram 300 depicting an example verification graph is provided. A verification graph may represent the structural paths between a source and a destination. The structural paths are prerequisites to functional paths and a verification application may verify a functional path. In some embodiments, graphs may be used to comprehend and validate paths being verified by the EDA application (e.g., identify logic not being tested or logic that is not supposed to be tested), to debug and visualize data propagation from counter-example waveform, and to guide formal engines to perform step-by-step proof (e.g., using graph-based proof strategies).

Figure 4:
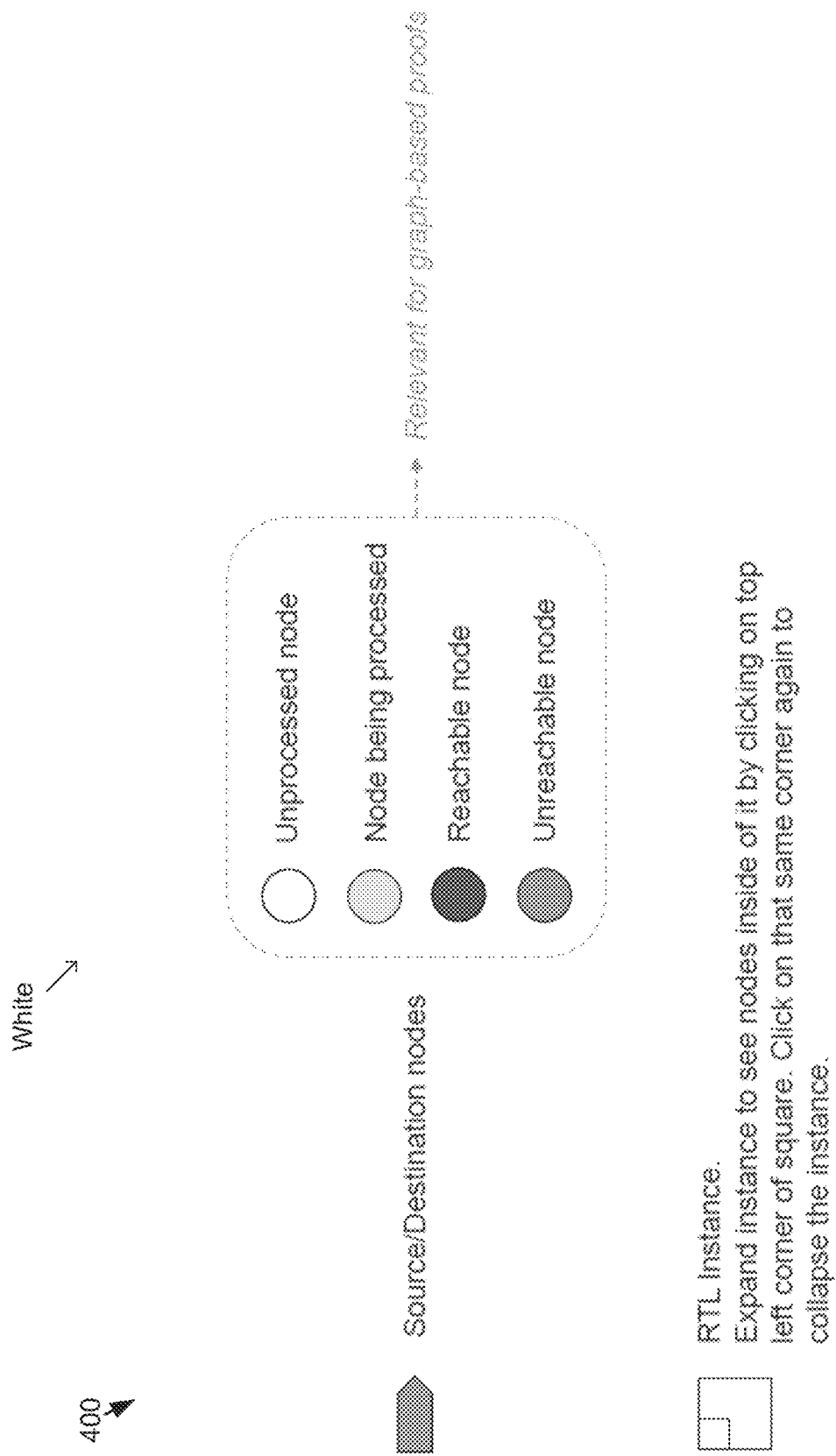
FIG. 4 is a diagram depicting an example consistent with embodiments of the present disclosure.
Figure 5:
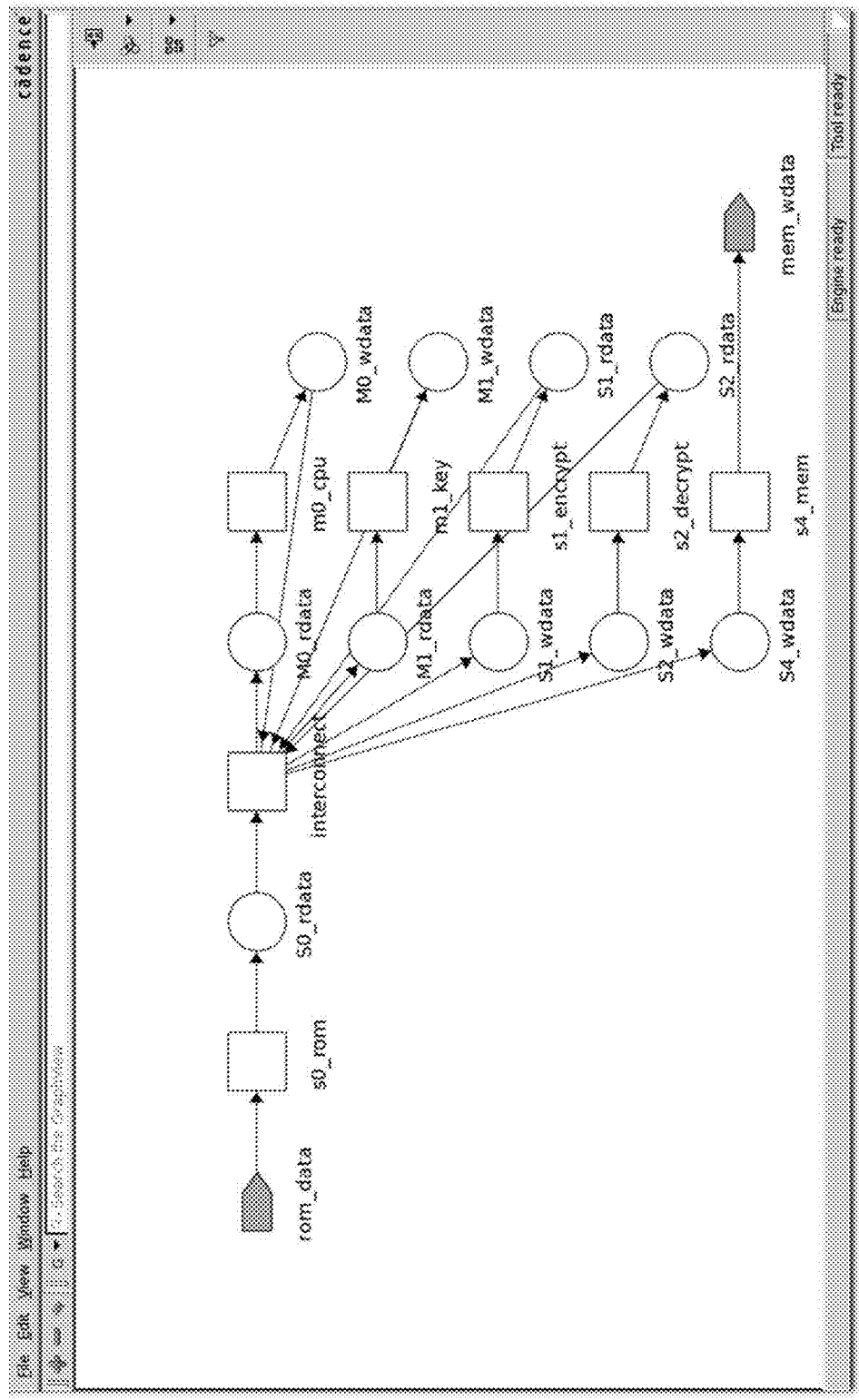
FIG. 5 is a graphical user interface depicting an embodiment in accordance with the present disclosure.
Figure 6:
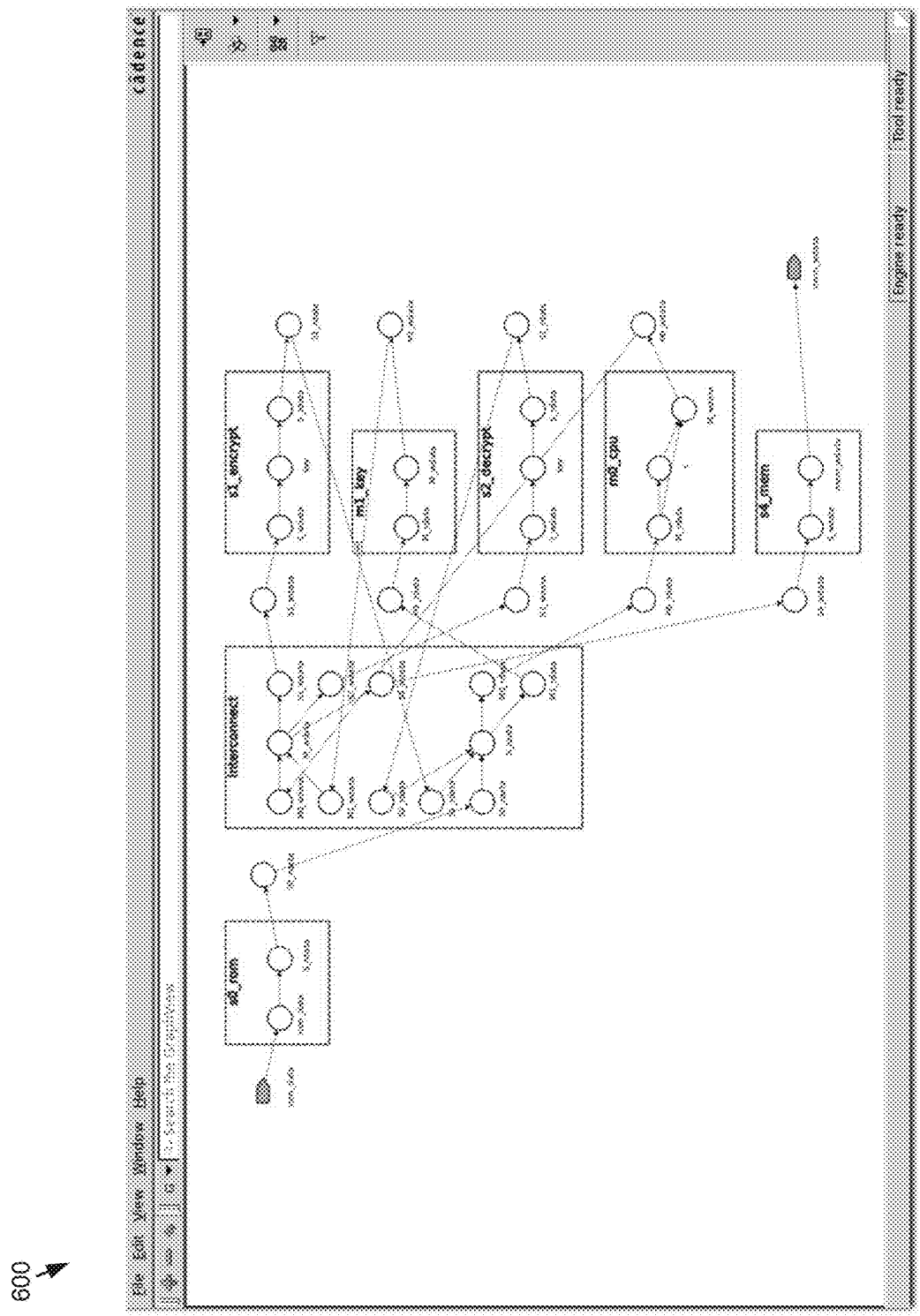
FIG. 6 is a graphical user interface depicting an embodiment in accordance with the present disclosure.

Referring now to FIG. 4, a diagram 400 depicting examples of associated graph annotations and symbols is provided. FIGS. 5-6 provide examples of verification application graphs. FIG. 5 shows an example of a collapsed graph 500 and FIG. 6 shows an example of an expanded graph 600.

In some embodiments, graph-based proof strategies (e.g., the forward, backward, parallel options discussed above) may provide an alternative to a regular proof command and may leverage a graph representation of a verification application property to implement proof strategies. These strategies may be used to generate helper assertions to/from intermediate nodes to guide the proof (e.g., indicate the proof progress, determine for each node if it is reachable or unreachable (e.g., reachable (CEX): data can propagate to/from that node, unreachable (proven): data cannot propagate to/from that node, etc.)).

Figure 7:
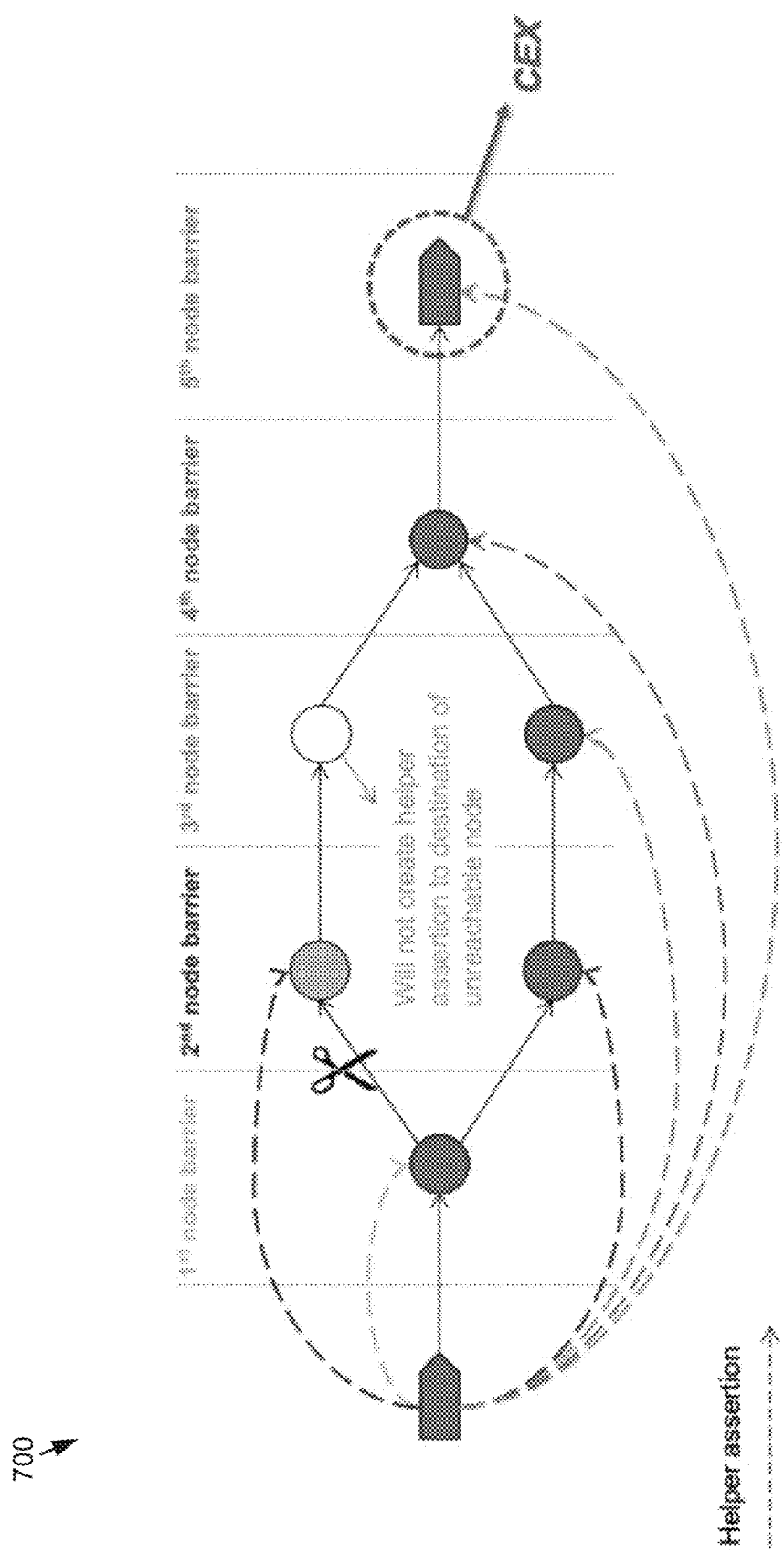
FIG. 7 is a diagram depicting an example consistent with embodiments of the present disclosure.

Referring now to FIG. 7, a diagram 700 depicting an example verification application graph utilizing a forward strategy is provided. This strategy may be used to generate helper assertions from the source node(s) to fanout of nodes that are reachable. This may cut off a connection to an unreachable node. In some embodiments, the process may address one node barrier at a time.

Figure 8:
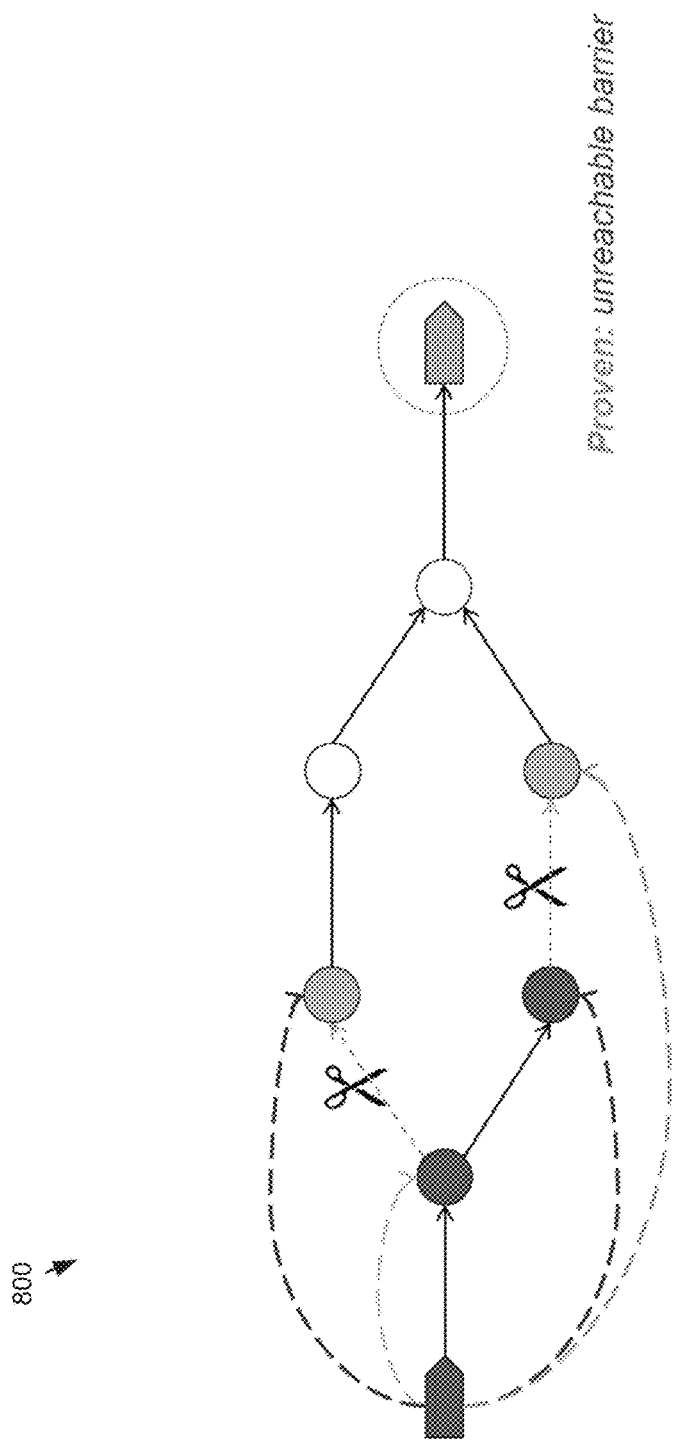
FIG. 8 is a diagram depicting an example consistent with embodiments of the present disclosure.

Referring now to FIG. 8, a diagram 800 depicting an example verification application graph utilizing a forward strategy is provided. This example provides an example diagram demonstrating an unreachable barrier. In some embodiments, the forward approach may be useful to visualize data propagating forward, debug unexpected CEX (e.g., debug helper assertion failure (CEX), helper assertion name: "<property name>_to_<node name>", etc.), to identify bottlenecks (e.g., barrier with nodes being processed (yellow) for a long time), and/or to locate unreachable barriers.

Figure 9:
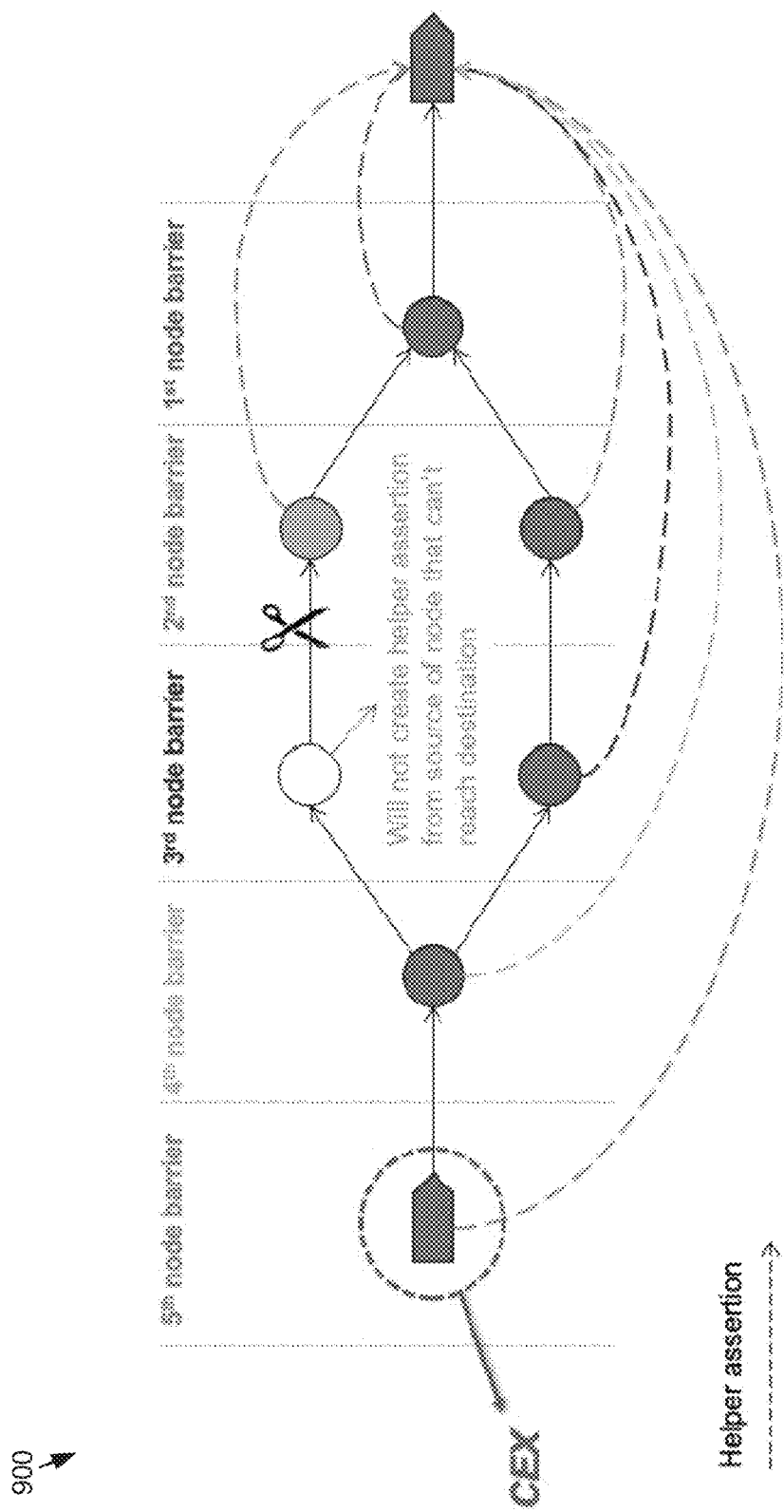
FIG. 9 is a diagram depicting an example consistent with embodiments of the present disclosure.

Referring now to FIG. 9, a diagram 900 depicting an example verification application graph utilizing a backward strategy is provided. In some embodiments, the backward approach may be useful to generates helper assertions to the destination node(s) from the source of nodes that can reach the destination node(s). This may cut off a path behind a node that can't reach the destination. In some embodiments, this process may progress one node barrier at a time.

Figure 10:
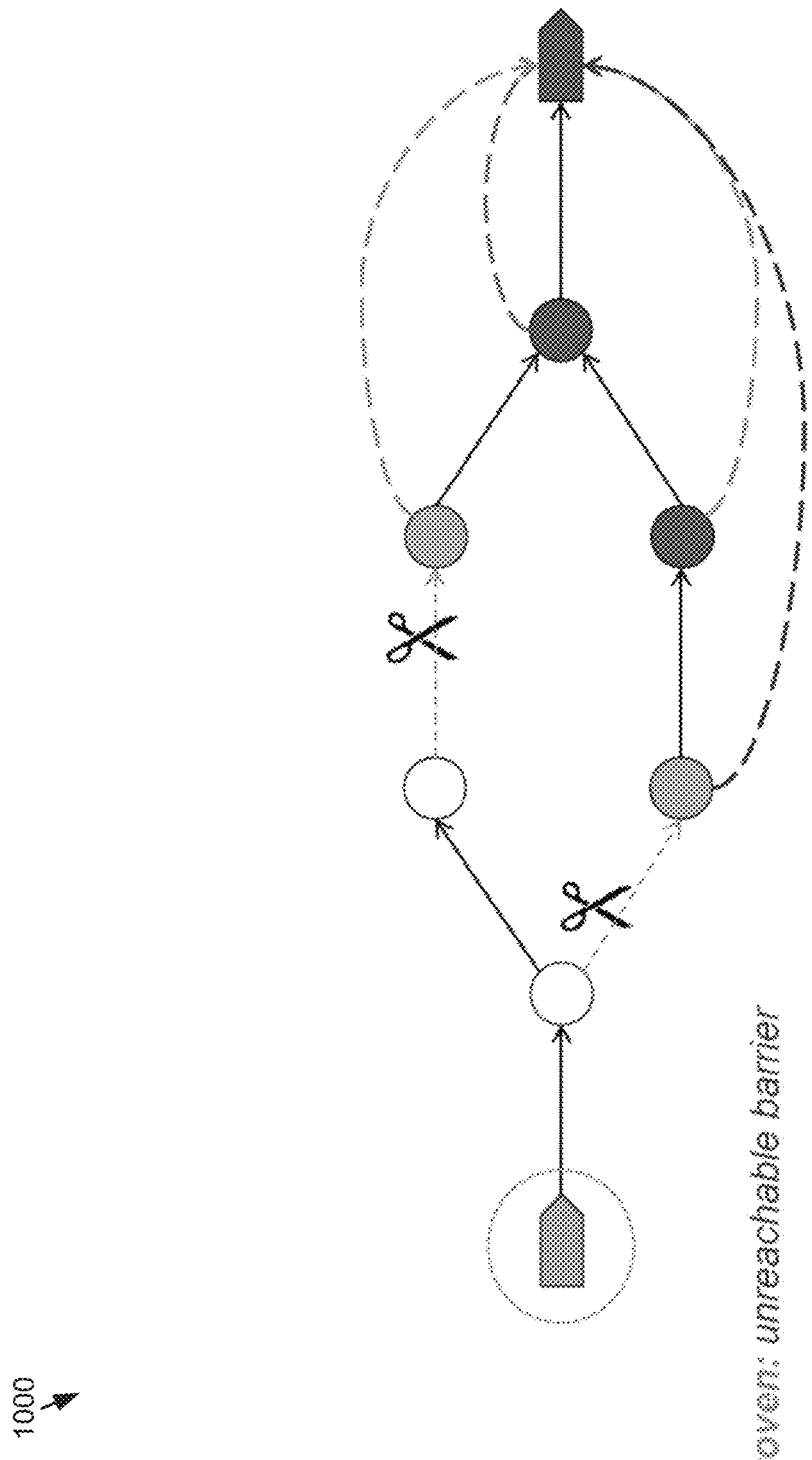
FIG. 10 is a diagram depicting an example consistent with embodiments of the present disclosure.

Referring now to FIG. 10, a diagram 1000 depicting an example verification application graph utilizing a backward strategy is provided. This example provides an example diagram demonstrating an unreachable barrier. In some embodiments, the backward approach may be used to visualize data propagating backward and debug unexpected CEX (e.g., debug helper assertion failure (CEX), helper assertion name: "<property name>_from_<node name>"), identify bottlenecks (e.g., barrier with nodes being processed (yellow) for a long time), find unreachable barriers, etc.

Figure 11:
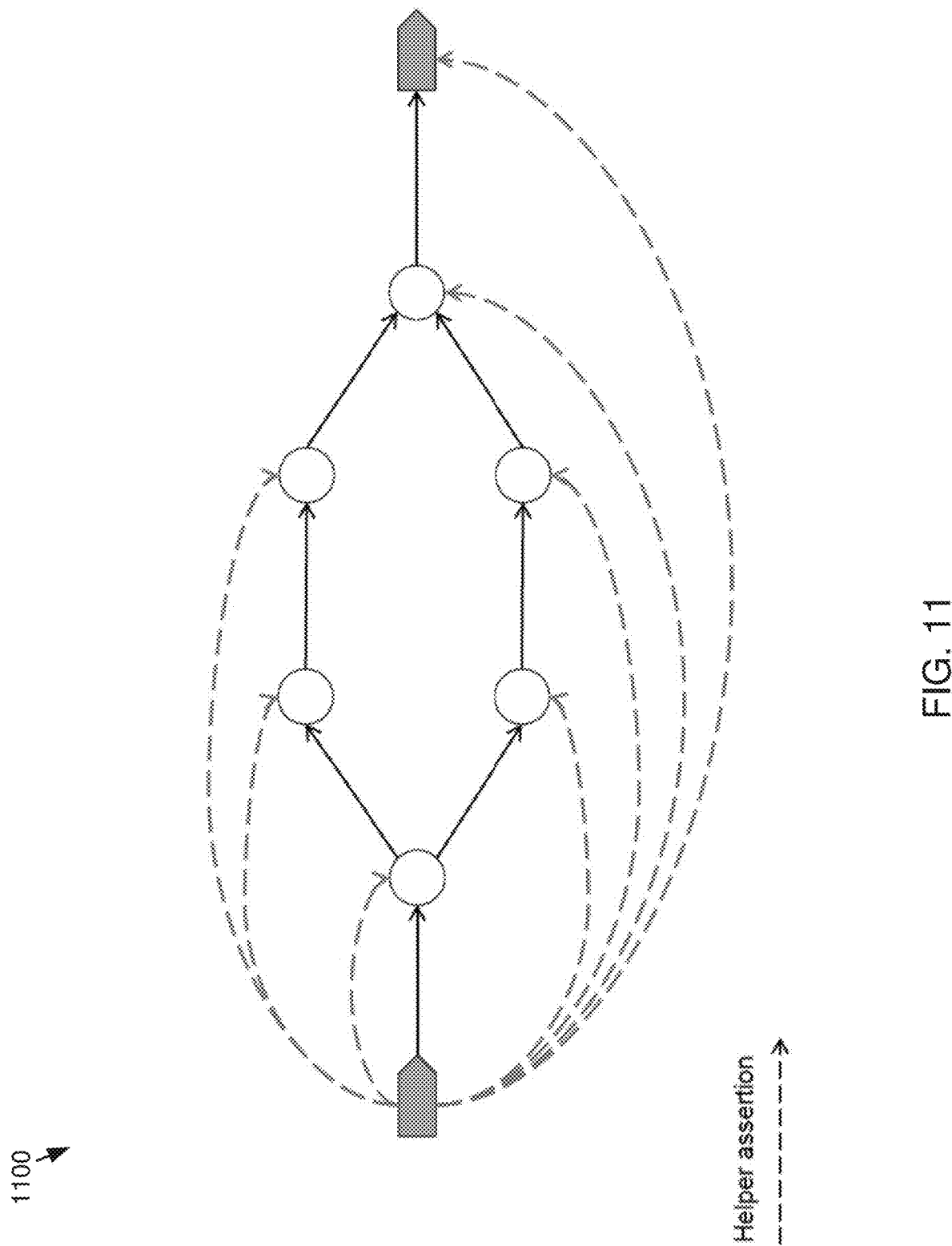
FIG. 11 is a diagram depicting an example consistent with embodiments of the present disclosure.

Referring now to FIG. 11, a diagram 1100 depicting an example verification application graph utilizing a parallel strategy is provided. In some embodiments, the parallel approach may be used to generate helper assertions from the source(s) node(s) to all other nodes. In some embodiments, all of the helpers may be generated at once.

Figure 12:
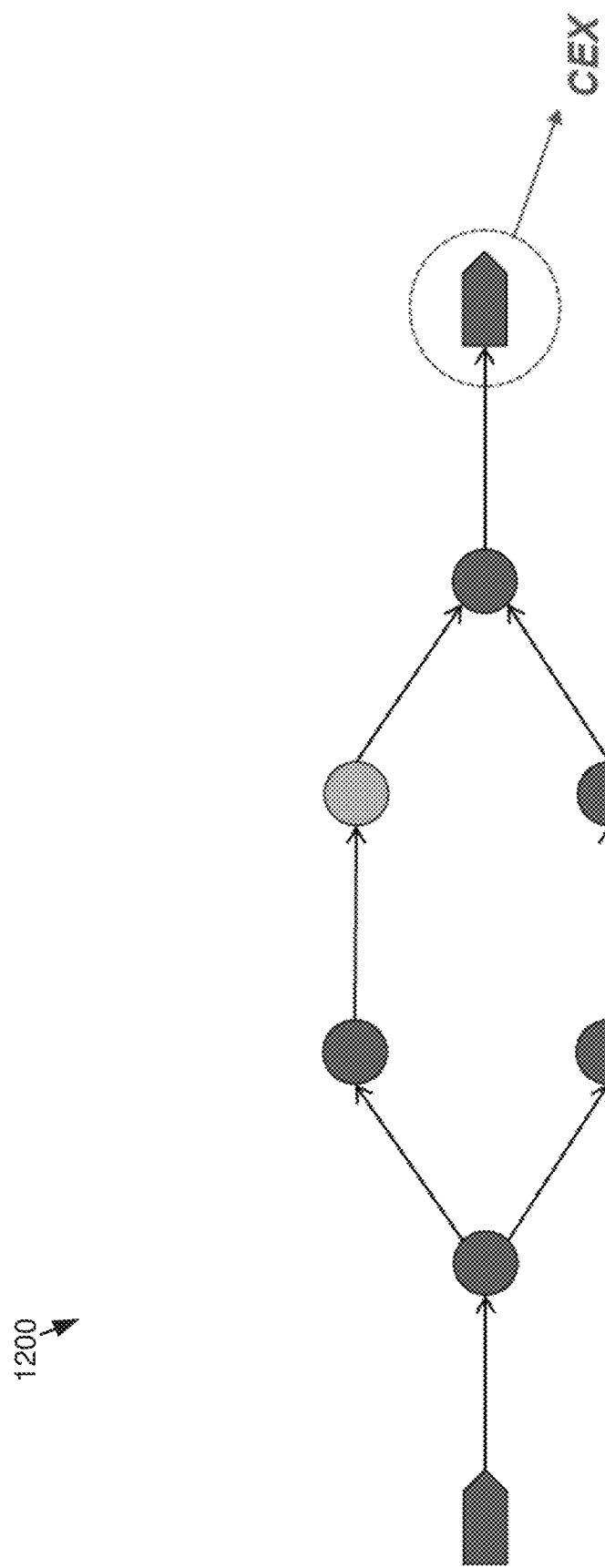
FIG. 12 is a diagram depicting an example consistent with embodiments of the present disclosure.

Referring now to FIG. 12, a diagram 1200 depicting an example verification application graph utilizing a parallel strategy is provided. In some embodiments, the parallel approach may provide a big picture of all nodes to which data can or cannot propagate. Additionally and/or alternatively, this approach may be used to debug unexpected CEX (e.g., debug helper assertion failure (CEX) on visualize, helper assertion name: "<property name>_to_<node name>", etc.). The parallel approach may identify bottlenecks (e.g., barrier with nodes being processed (yellow) for a long time) and to boost performance for bug hunting (e.g., CEX are used as new reset states to hunt for deeper bugs more quickly).

Figure 13:
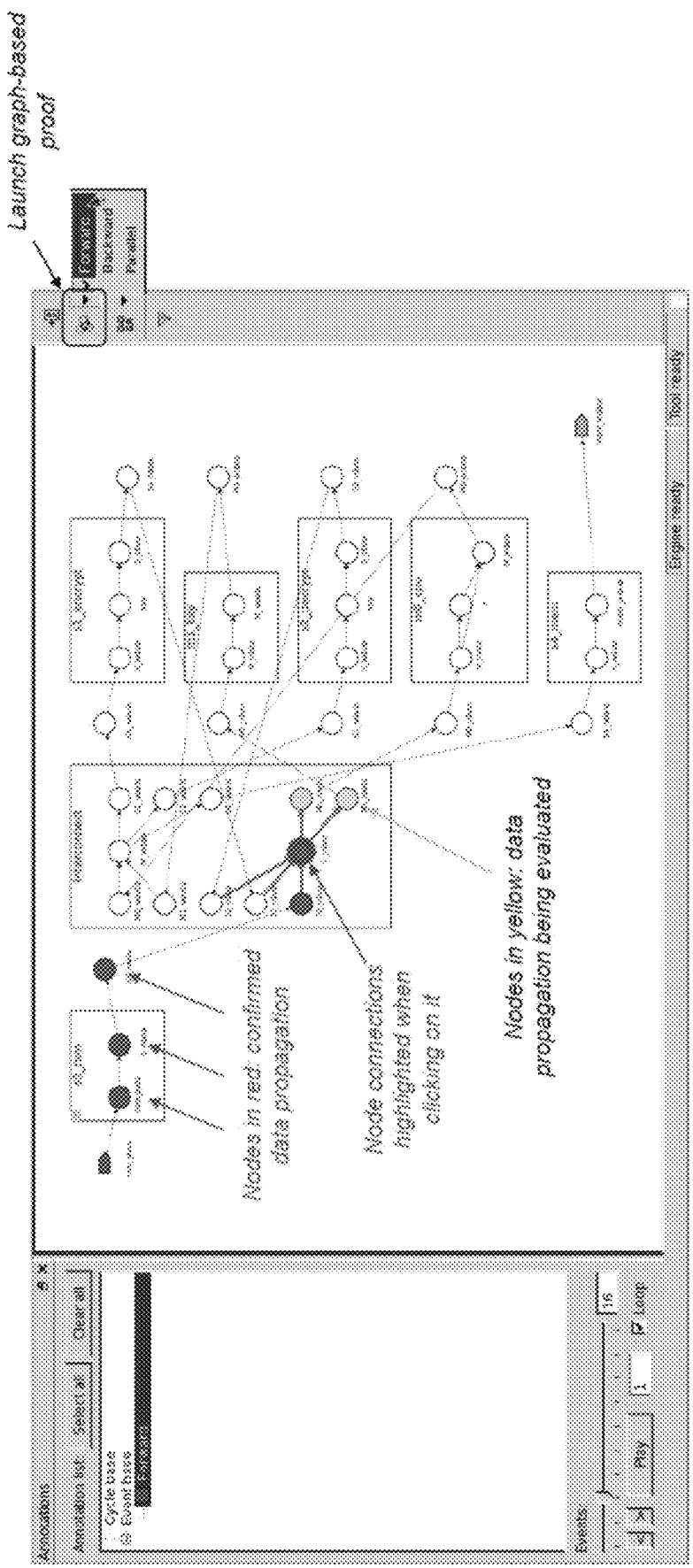
FIG. 13 is a graphical user interface depicting an embodiment in accordance with the present disclosure.
Figure 14:
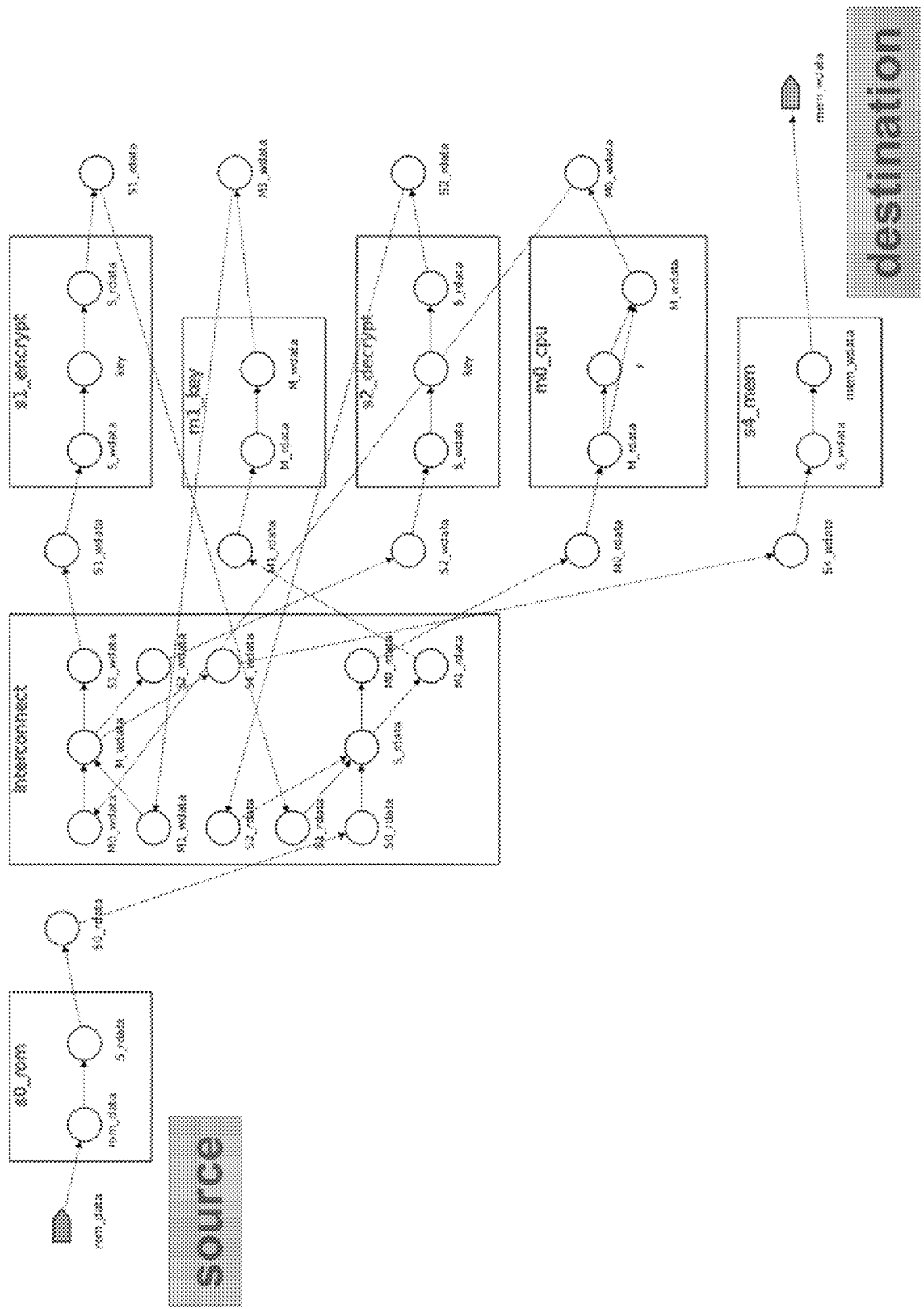
FIG. 14 is a diagram depicting an embodiment in accordance with the present disclosure.
Figure 15:
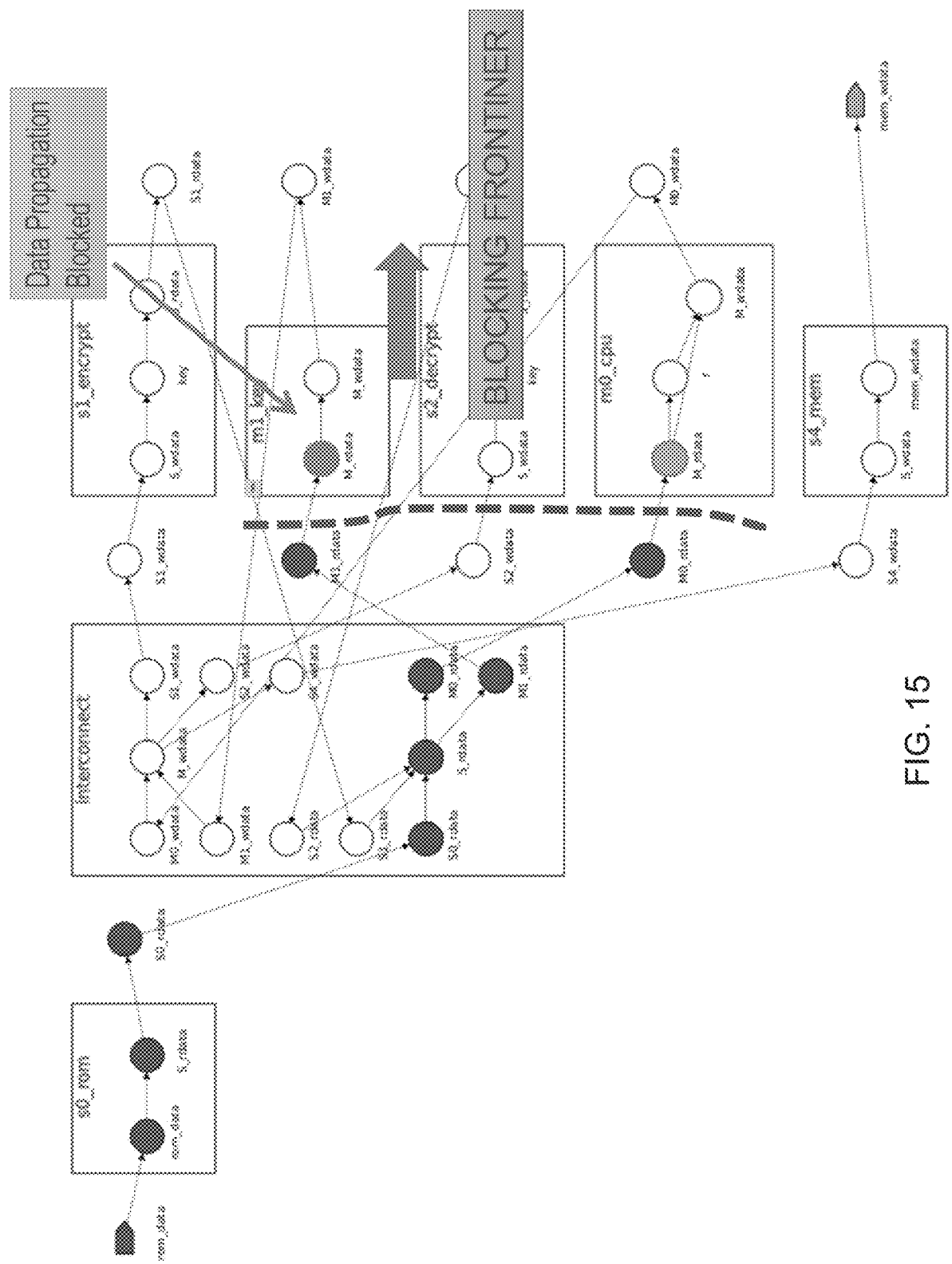
FIG. 15 is a diagram depicting an embodiment in accordance with the present disclosure.
Figure 16:
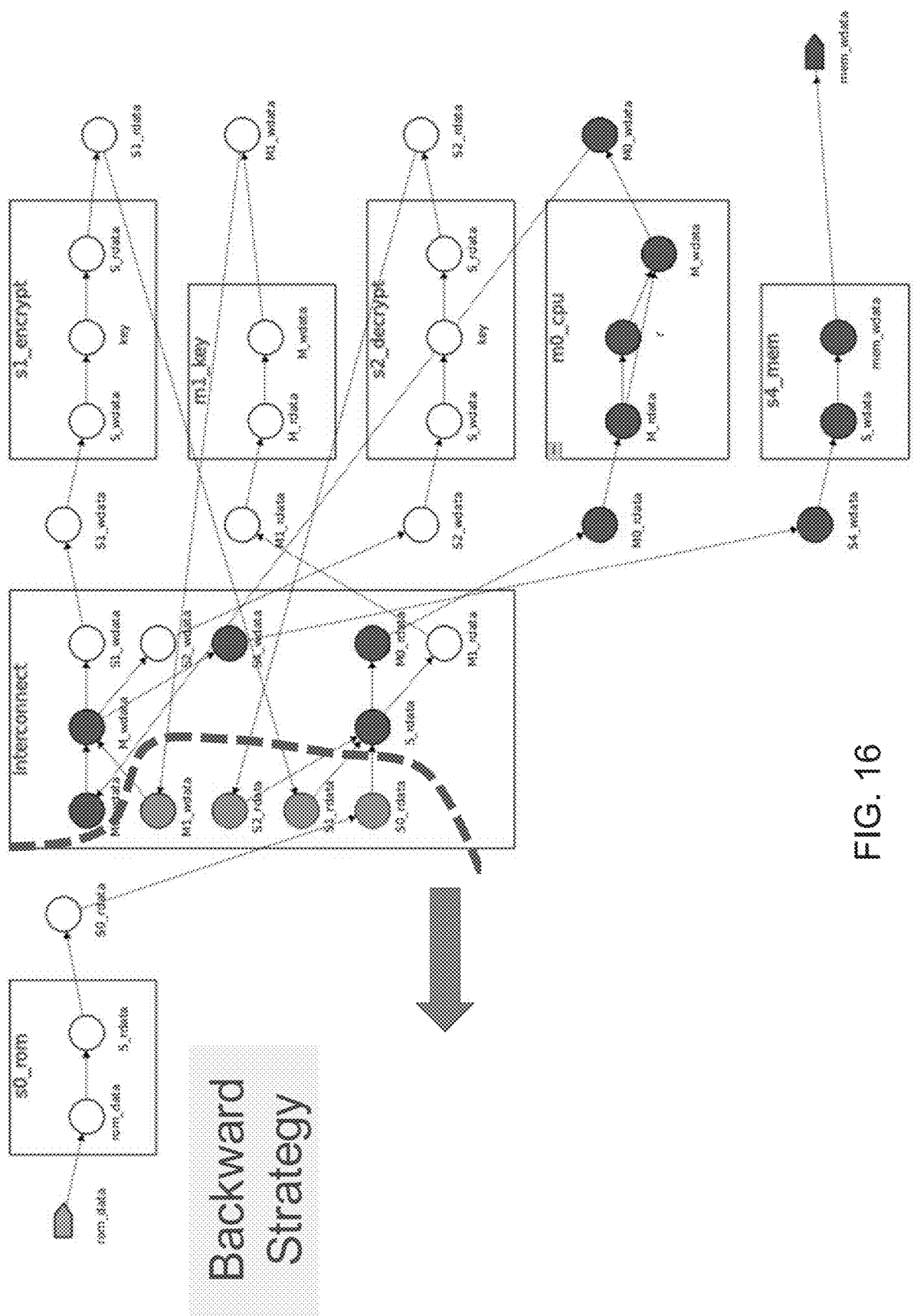
FIG. 16 is a diagram depicting an embodiment in accordance with the present disclosure.

Referring now to FIGS. 13-16, a number of graphical user interface examples are provided consistent with embodiments of the present disclosure. FIG. 13 shows an example of a graph-based proof strategy showing a live update of data propagation while proving property. FIGS. 14-16 show unreachable barrier examples for existing strategies.

Referring now to FIGS. 17-24, embodiments consistent with hierarchical proof process 10 are provided. Existing verification application approaches are traditionally deemed as hard to converge. The nature of a verification application property may be intrinsically more complex due to path sensitization technology. Verification applications are usually applied in larger designs, where security requirements are usually described but where formal verification's scalability struggles due state space explosion. Security is critical as users are highly interested in getting a proven result. Much stronger than what they can ever achieve in simulation (exhaustive, supports data mutation). The quality of a given simulation test may depend on the "hacking ability" of verification engineer and, as such, proof automation in verification applications could be improved. Forward and backward graph-based proof based strategies may help find proven results by induction and parallel can help find CEX through bug hunting. The very low granularity of the graph used to guide the proof adds too much overhead and makes them inefficient most of the time. In some embodiments, it may be possible to split a property into smaller, more manageable paths. This may require manual effort and design knowledge to pick interesting "checkpoints", however, this is often too much effort depending on how many checkpoints or "splits" are created. It is difficult to monitor all of the splits and combining the proof results of each split into a result for the main property.

XPROP verification application approaches can also be hard to converge. Underlying technology (path sensitization) is the same as other verification applications, and therefore complex. An XPROP verification application may be recommended for an IP level, but sometimes users want to run on larger designs. XPROP verification applications may create far more properties than other verification applications. Multiple X sources (potentially 100s) affecting each X destination, and many X targets (100s or 1000s). Other verification applications usually have 10-50 properties at most, each property usually with a single source and a single destination. Proof automation in an XPROP verification application approaches could also be improved. Automation may be currently represented by parallel graph-based proof strategy similar to those discussed above, which may suffer from the same low granularity and overhead of the verification application graphs discussed above. Solutions to overcome complexity are usually to split X targets into multiple tasks, which does not impact convergence as much or to break design into smaller blocks. In this case, putting results back together requires considerable manual work. This may be particularly problematic for an application that is supposed to be push-button and designer-friendly.

Accordingly, embodiments of hierarchical proof process 10 may be configured to automatically split path sensitization properties into smaller paths in an informed, consistent and scalable way to make the proof more amenable to formal verification. The process may automatically run the proof on these smaller paths and determine how data propagation analysis on each smaller path affects the original property.

In this way, embodiments included herein may automatically consider higher-level instances in the path as if they were black-boxes. For example, the process may operate as if stopats were applied to all ports from those instances. Embodiments may create checks for paths around "black-boxed" instances and prove them (e.g., the prove may be parallel (all inter-instance path checks run at once) or forward/backward, mimicking graph-based strategy traversal options. In some embodiments, the proof results and scenarios for these inter-instance paths may be proven, undetermined, and/or CEX. Proven may indicate that no functional path exists through these paths connecting two instances. Here, information may be used to simplify proof process. Unreachable barriers can be found and avoid processing of more complex logic inside instances that remained "black-boxed". An undetermined situation indicates that engines cannot conclude if there is a functional path or not. This may indicate that the path is still too complex and could be further split into smaller pieces. A CEX may indicate that a functional path exists through these paths connecting two instances (e.g., move "black-box" to instances one level down and repeat process, if instance has no sub-instances: create inter-instance checks from instance inputs to instance outputs).

In some embodiments, hierarchical proof process 10 may look for proven results that do not necessarily exercise the most complex bits of the problem and, combined, can prove main property by induction (aka "unreachable barrier"). This is the goal of verification applications' forward/backward graph-based proof strategies, but current implementation relies on hoping the "unreachable barrier" will be either close to the destination or close to the source. In a best-case scenario for hierarchical proof process 10 an unreachable barrier may be found quickly while complex logic was avoided. If an "unreachable barrier" is located a proven result may be found. An average scenario may involve spending time iteratively going deeper into instances and some paths ruled out along the way. The ruled out paths may be used to speed up proof of main property or provide understanding of instances not in the functional propagation path. In a worst-case scenario, too much time may be spent iteratively going deeper into instances and no paths ruled out. Here, it is unlikely that no paths are ruled out. CEX for inter-instance paths can still be leveraged for bug hunting.

Figure 17:
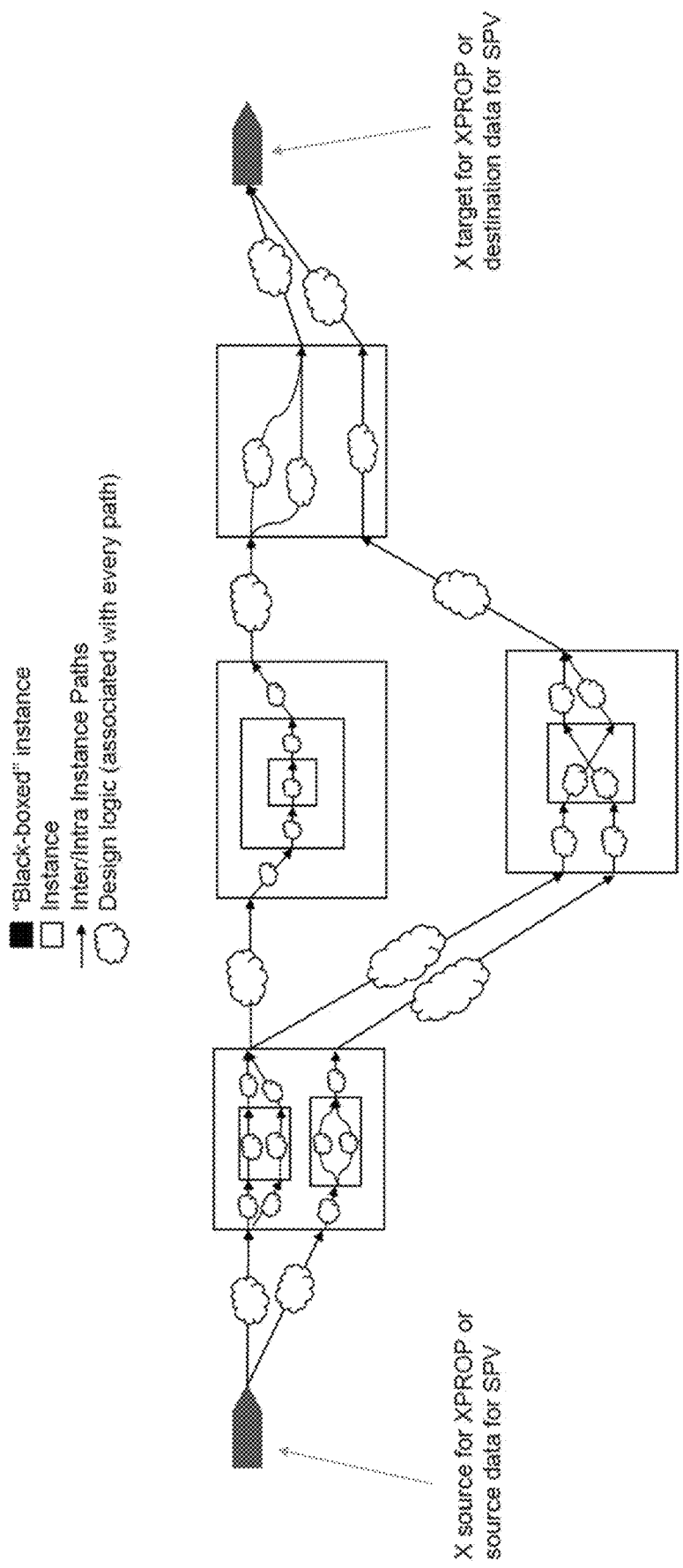
FIG. 17 is a diagram depicting an embodiment in accordance with the present disclosure.
Figure 18:
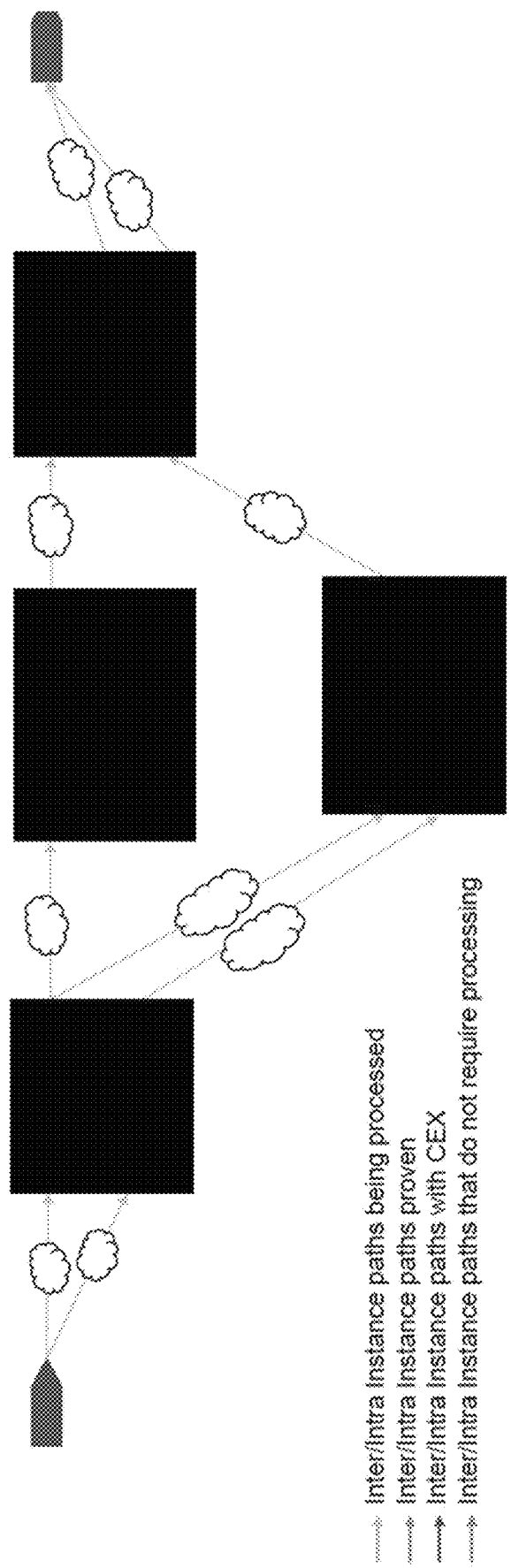
FIG. 18 is a diagram depicting an example consistent with embodiments of the present disclosure.

FIG. 17 shows an example diagram depicting source and target/destination. In this example, a number of instances are provided with inter and intra instance paths included. Design logic may be associated with every path and black box instances are shown beginning in FIG. 18. In a first iteration the first level instances may be considered as if they were black-boxed and the inter/intra instance paths may be processed. The paths shown in FIG. 18 include only the inter/intra instance paths.

Figure 19:
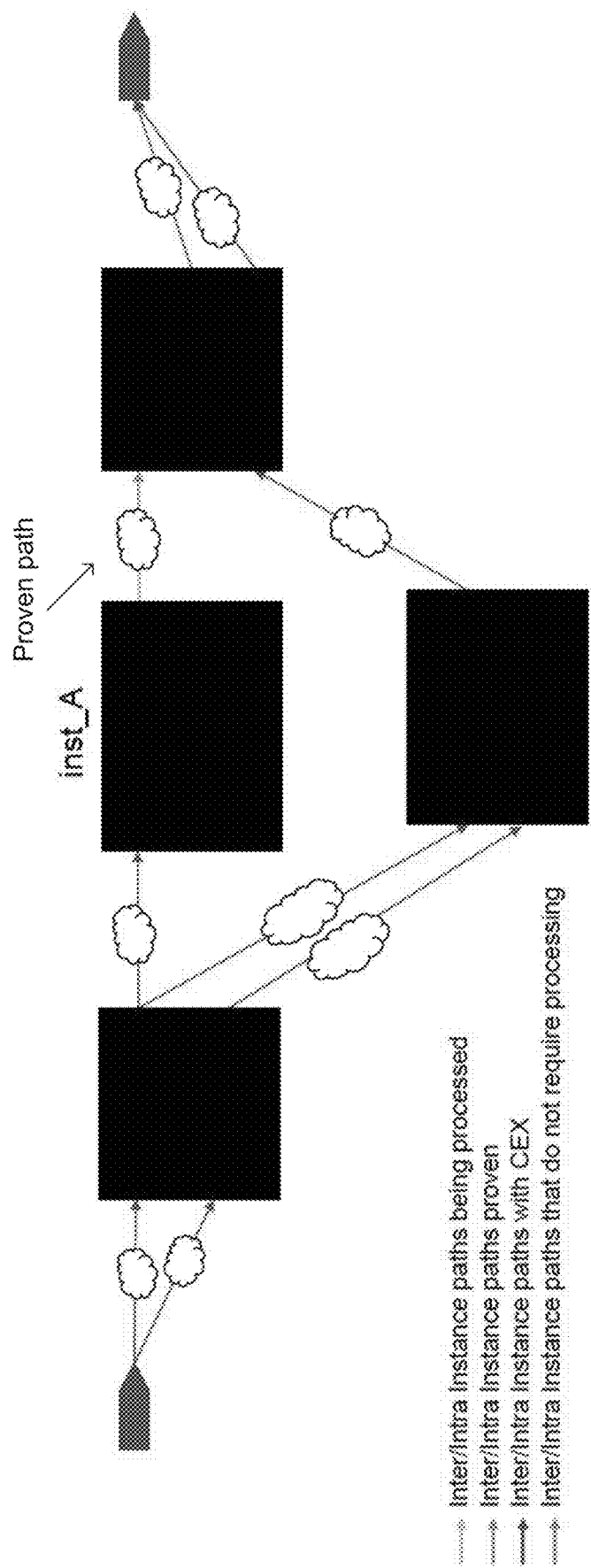
FIG. 19 is a diagram depicting an example consistent with embodiments of the present disclosure.

Referring now to FIG. 19, one proven path is shown leaving an instance (e.g., inst_A), which means that source data cannot propagate through it. All other paths shown are inter/intra paths with CEX. In this example, there is no need to go deeper into "inst_A", all other instances need to go one level down.

Figure 20:
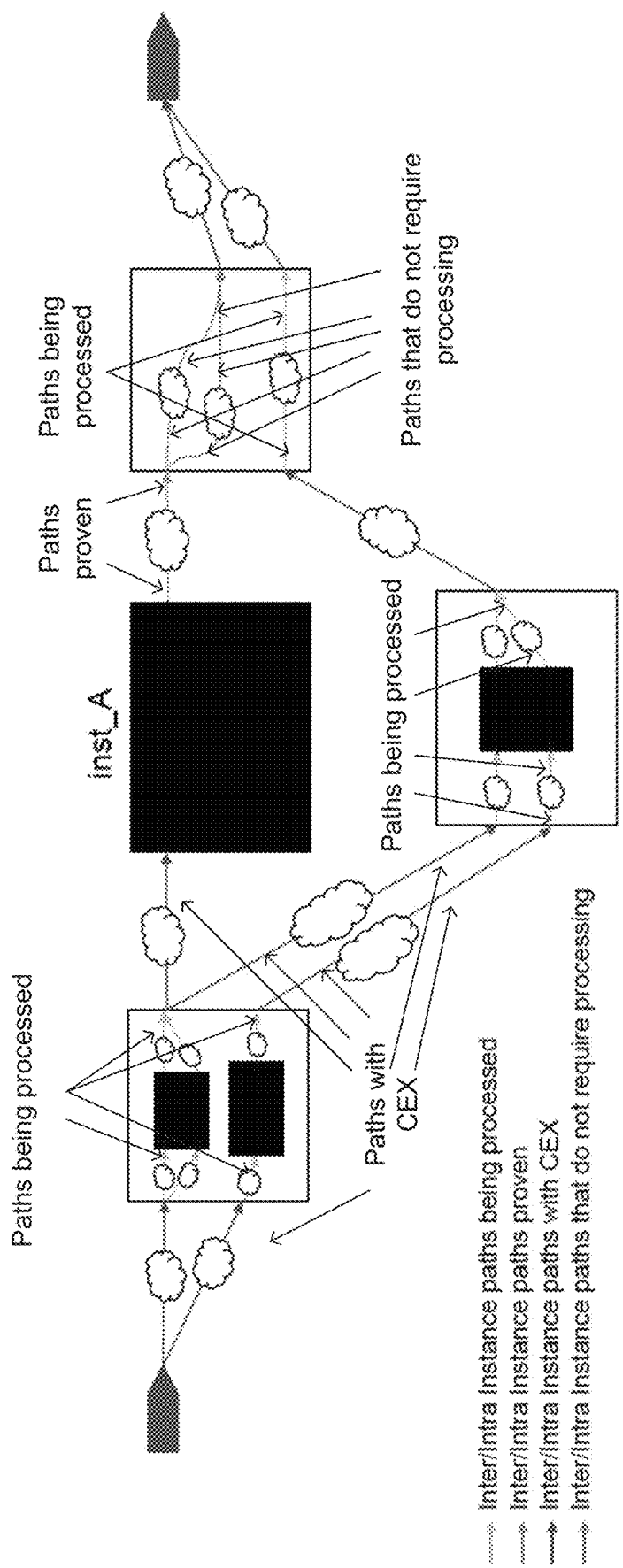
FIG. 20 is a diagram depicting an example consistent with embodiments of the present disclosure.

Referring now to FIG. 20, in a second iteration, second level instances may be considered as if they were black-boxed. In this example, the system may process inter/intra instance paths, however, there is no need to process paths that rely on already proven inter-instance path leaving "inst_A".

Figure 21:
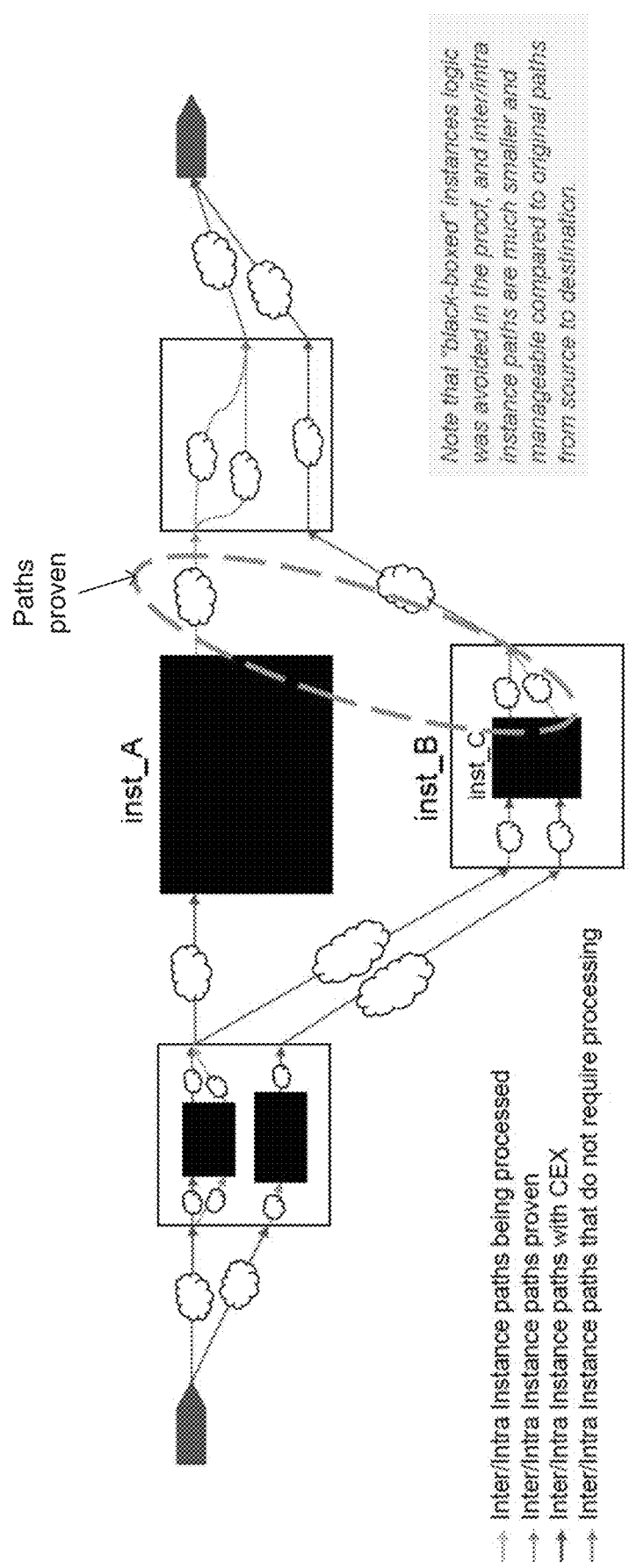
FIG. 21 is a diagram depicting an embodiment in accordance with the present disclosure.

Referring now to FIG. 21, in a second iteration, second level instances may be considered as if they were black-boxed. In this example, note that "inst_B.inst_C"→"inst_B" paths are proven. Combined with proven path leaving "inst_A", these paths configure an unreachable barrier. No further processing is necessary.

Figure 22:
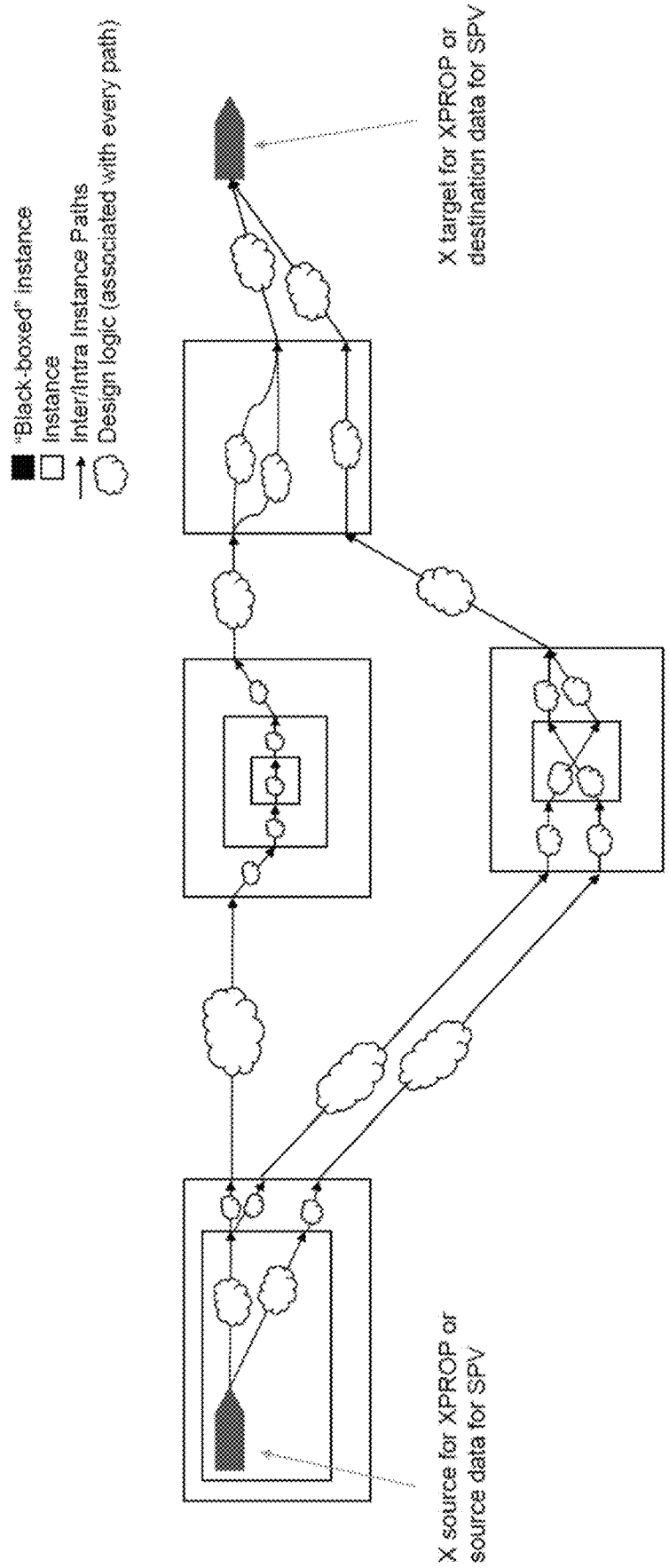
FIG. 22 is a diagram depicting an embodiment in accordance with the present disclosure.
Figure 23:
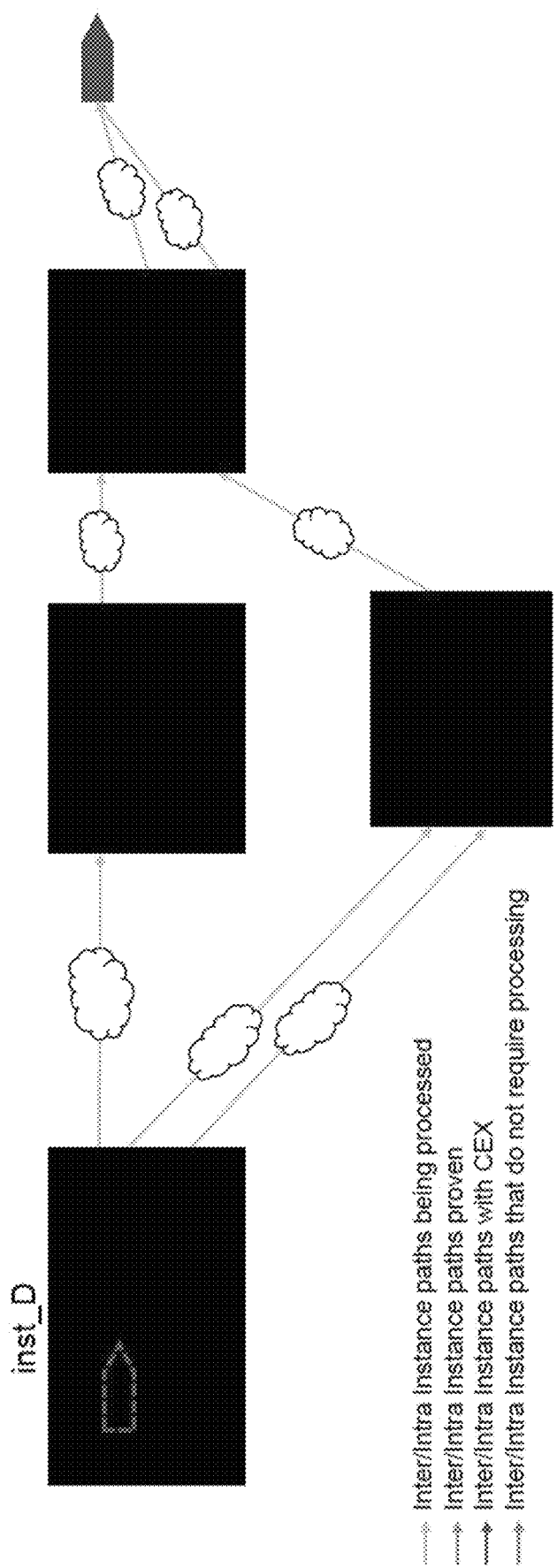
FIG. 23 is a diagram depicting an embodiment in accordance with the present disclosure.

Referring now to FIGS. 22-23, an example is provided showing a source signal inside an instance. Alternatively, a destination signal may be provided inside an instance. FIG. 23 shows a first iteration where first level instances may be considered as if they were black-boxed. In this particular example, the source signal is inside a "black-boxed" instance "inst_D". All paths may be processed as inter/intra instance paths.

Figure 24:
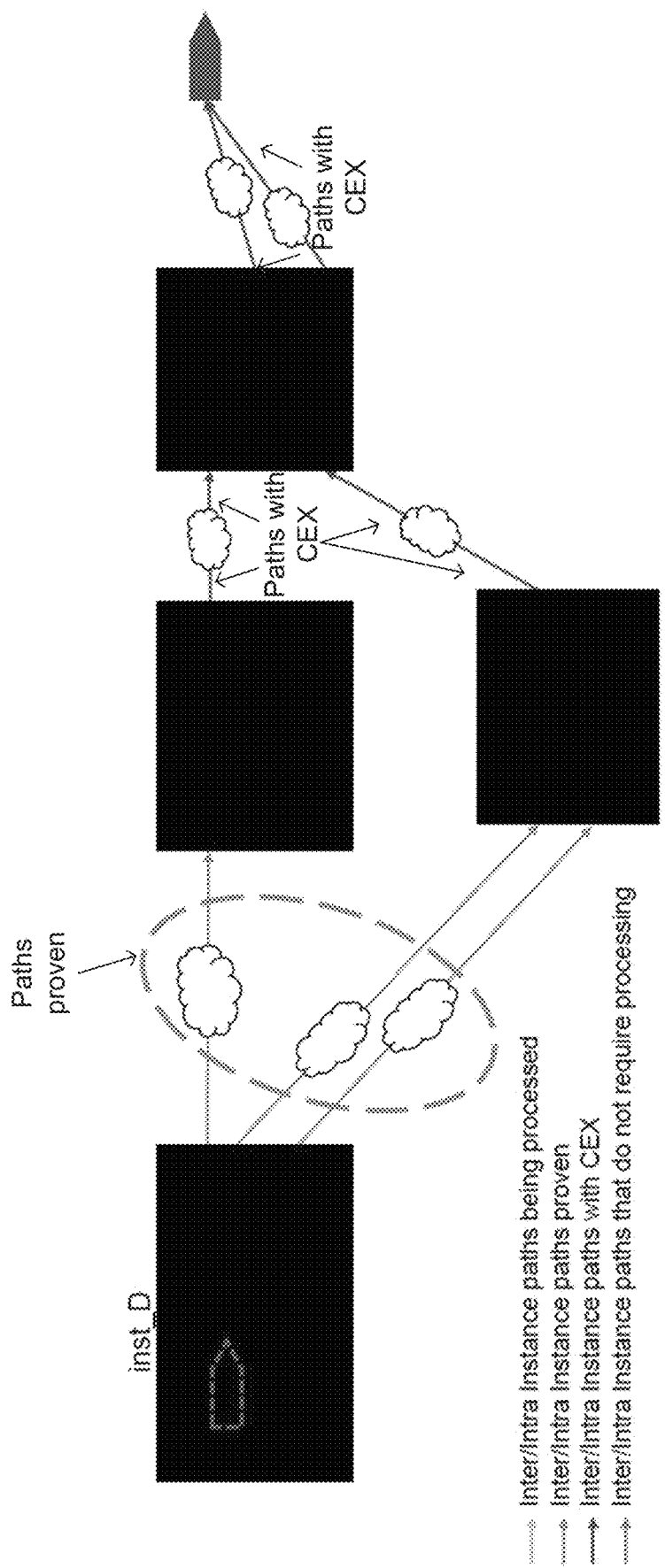
FIG. 24 is a diagram depicting an embodiment in accordance with the present disclosure.

Referring now to FIG. 24, an example showing a first iteration where first level instances may be considered as if they were black-boxed is provided. In this example, proven paths leaving instance "inst_D" mean data cannot propagate to other instances. Since source data is inside that instance, these paths are an "unreachable barrier" and main property is proven. No further processing is necessary.

Embodiments of the present disclosure provide a number of improvements over existing technologies. For example, the process may iteratively abstract logic, bringing in logic as necessary if the properties created in each iteration are not enough to prove the main property by induction. Additionally and/or alternatively, the process uses design hierarchy information to guide abstractions and property creation. The intermediate signals processed between source and destination are exclusively instance ports. Existing methods (e.g., forward, backward and parallel graph strategies) works with all wires between source and destination. The logical abstraction described herein may greatly help formal verification have better performance and scale to larger, more complex designs. The choice to work with intra/inter instance paths makes sense when considering how to split the main property into smaller paths automatically. If a large subsystem or SoC is considered, for example, logic integrating all different IPs in this SoC will likely have a gating mechanism to selectively let data propagate from one IP to the other. This glue logic tends to be more combinational than sequential therefore representing much less complexity than the logic processing data being tracked inside specialized IPs and instances. The intermediate signals from structural paths between source and destination are strictly instance ports, and, as such, the graph for the problem at hand has much fewer signals than the current graph, which contains all signals. A graph with fewer intermediate signals means less overhead and number of iterations in the proof process.

Some users are commonly interested in targeting larger designs. This is where security requirements are typically described, for example in large subsystems, even SoCs, etc. Formal verification's intrinsic exhaustiveness is great to find corner case bugs and deliver a proven result that is bulletproof. This is in contrast with simulation's pass result being based on finite set of tests run, however, it makes scalability an issue as it is very challenging to explore all states and converge on properties.

As discussed above, one option to cope with this scalability issue is to look for opportunities to apply black-boxes to mask out complex logic and reduce the COI of properties and therefore complexity of asserts. However, black-boxes cut off structural paths. Some of these paths could have represented a security requirement data propagation violation.

Figure 25:
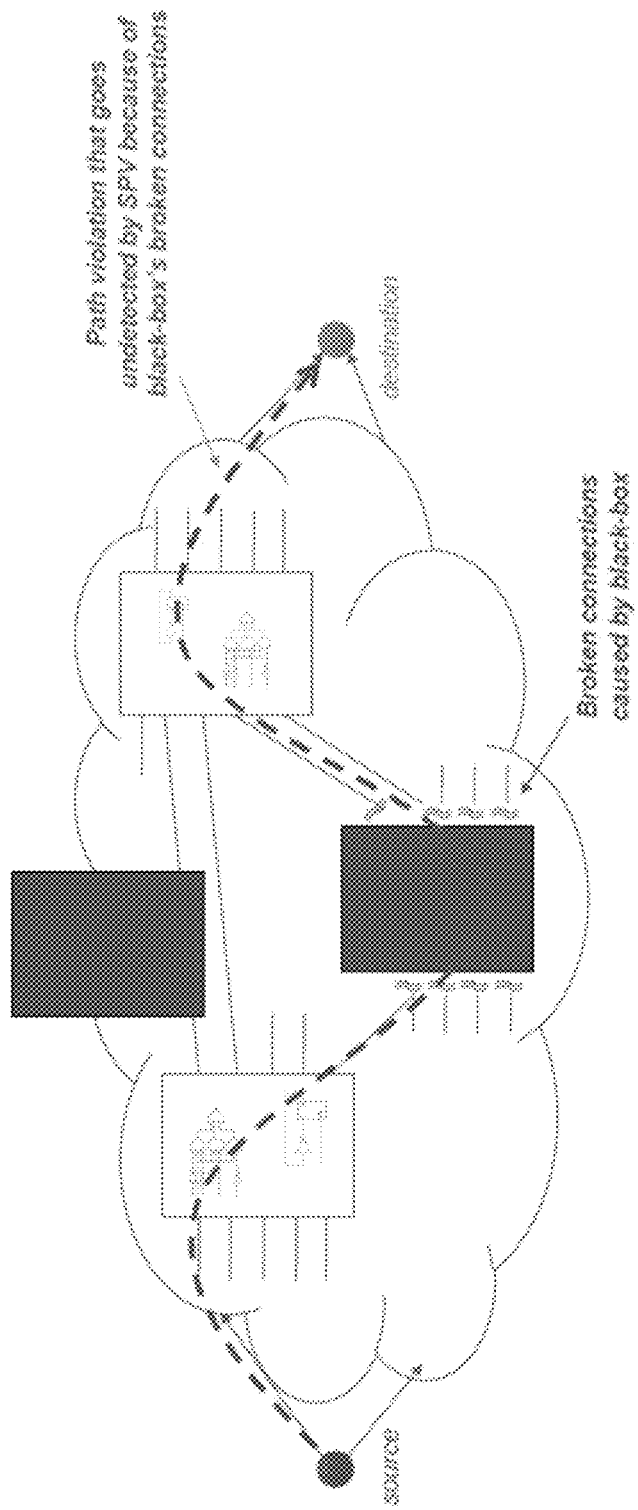
FIG. 25 is a diagram depicting an embodiment in accordance with the present disclosure.
Figure 26:
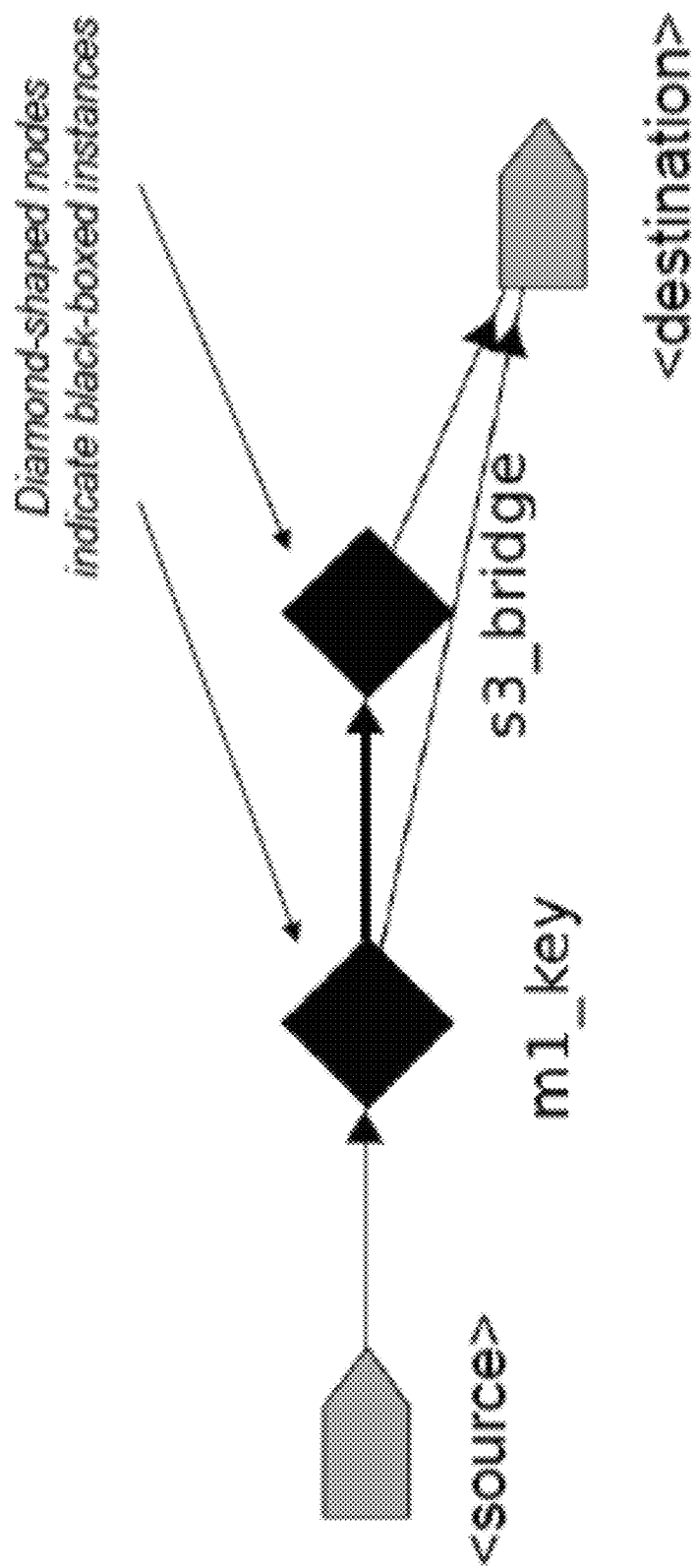
FIG. 26 is a diagram depicting an example consistent with embodiments of the present disclosure.

Referring now to FIG. 25, an example showing that verification application properties specify source signal(s) that may never propagate to destination signal(s). Existing applications may include a capability called consistency check, which for a given verification application property specified in terms of source(s) and destination(s) signals, will tell the user if there are any black-boxes potentially cutting off structural paths. For example, this may cut off structural paths and may hide functional paths. Moreover, consistency check may include a textual report and a graph representation of how black-boxes cutting off structural paths between source(s) and destination(s) are interconnected. An example of a consistency check graph is shown in FIG. 26. The deficiency with this solution as is, is that it does not provide a strong evidence that the black-box must be removed. The black-boxes only pose a real threat if data can propagate to or from black-boxes boundaries. For example, if the source data from verification application property cannot propagate to the inputs of a black-box in the way towards the destination signal from the property, then the black-box is not hiding any CEX and can be maintained in the setup. It is not interesting to remove black-boxes unnecessarily. The black-boxes are usually there for a good reason: to reduce complexity. If a black-box is removed, the threat of hiding a violation is gone but the verification application can struggle to converge on a result. Using the information currently provided, the recommendation is for users to manually check paths around black-boxes. This adds a heavy manual burden to the user. If there are multiple black-boxes in the path, it can be difficult for users to keep track of all paths in between black-boxes that must be checked and how these path's data propagation capability status add up to decide which black-boxes are safe and which black-boxes are not safe.

Accordingly, embodiments included herein may be configured to automatically check paths around black-boxes. The process may automatically check paths around black-boxes for their capability to propagate data as is discussed in further detail below. For a given verification application property, the process may determine which black-boxes are cutting off structural paths between source and destination signal(s) and how they are connected between each other and the source and destination signal(s). Once the automatic check run is triggered, the process may automatically generate properties checking paths around black-boxes detected in the path between source and destination signal and start proving them.

In some embodiments, once the proof is done running, the process may combine all generated properties' proof statuses to return a number of results. These may include which black-boxes are safe, that is, they cannot hide a functional path between source and destination signal(s). Results may also include which black-boxes are not safe: they may be hiding a functional path between source and destination signal(s). With the information returned above, the user can take action to remove unsafe black-boxes, replace unsafe black-boxes with an abstracted model of user's choice, and/or ignore unsafe black-boxes in case violation paths going through them are not of interest.

Figure 27:
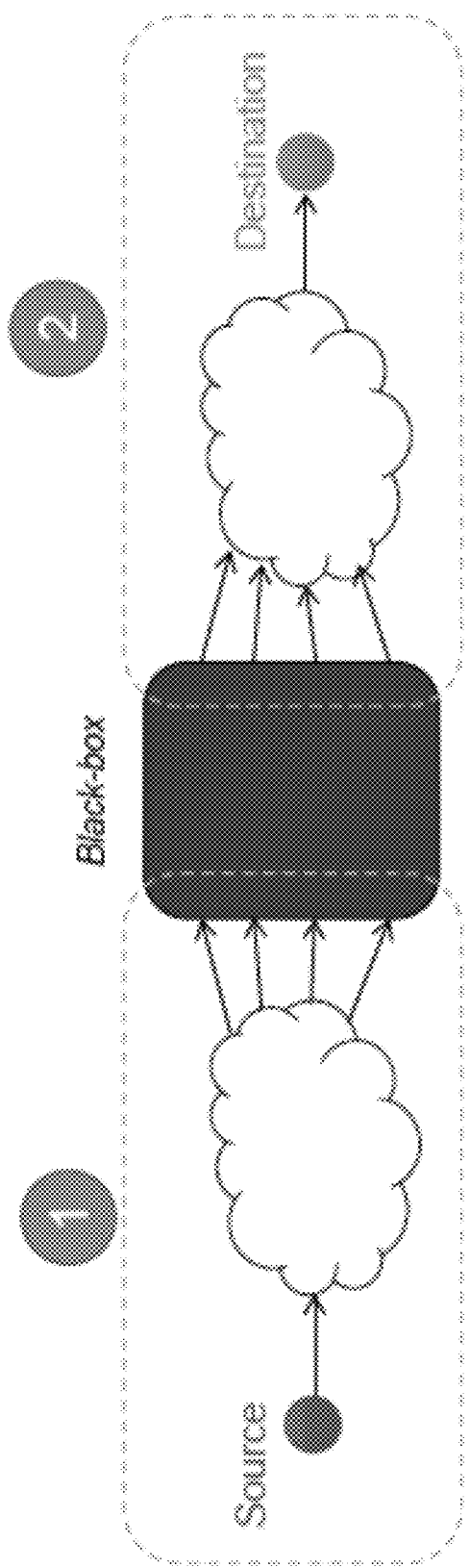
FIG. 27 is a diagram depicting an embodiment in accordance with the present disclosure.
Figure 28:
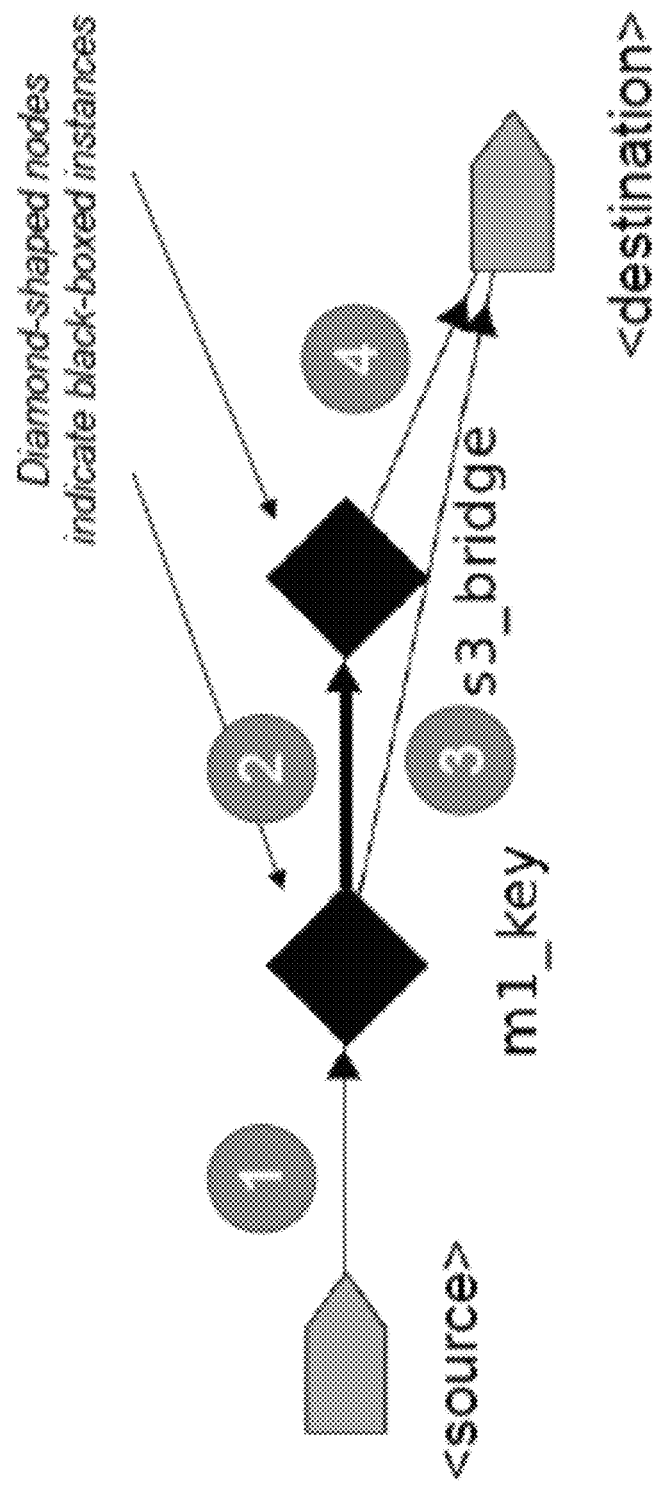
FIG. 28 is a diagram depicting an example consistent with embodiments of the present disclosure.

Referring now to FIGS. 27-28, examples of the process described above are provided. FIG. 27 shows a single black-box between source and destination. In this example, the automatic black-box path check may generate two properties to check, namely, whether data from <source> may propagate to any black-box input it is connected to or whether data from any black-box output connected to <destination> propagate to <destination>. The automatic check may process proof results as described below. If check 1 or 2 above returns that data can never propagate, then the black-box is safe. If checks 1 and 2 both return that data can propagate, then the black-box is unsafe.

Referring now to FIG. 28 a second example showing multiple black-boxes between source and destination is provided. The automatic black-box path check will generate four properties to check. Namely, whether data from <source> may propagate to any m1_key input connected to it, whether data from any m1_key output may propagate to any s3_bridge input connected to it, whether data from any m1_key output connected to <destination> may propagate to <destination>, and whether data from any s3_bridge output connected to <destination> may propagate to <destination>. The automatic check process may proof results as discussed below. If 1 cannot propagate data, the m1_key and s3_bridge black-boxes are safe. If 1 can propagate data and 2 cannot propagate data then the s3_bridge black-box is safe. If 1 and 2 can propagate data and 4 cannot propagate data then the s3_bridge black-box is safe. If 1 and 2 can propagate data and 4 can propagate data then the s3_bridge black-box is unsafe. If 1 can propagate data and 3 cannot propagate data then the m1_key black-box is safe. If 1 can propagate data and 3 can propagate data then the m1_key black-box is unsafe.

As discussed above, embodiments of the present disclosure may be configured to automatically check inter-instance paths starting from the top of an instance hierarchy and moving down each instance level only as needed (e.g., when there still a possibility of data from source to propagate to destination). This may allow the EDA application to automatically and consistently implement a divide and conquer approach without user manual intervention. In the process of checking inter-instance paths, the process may abstract contents inside one or more instances that are not mandatory for the path being checked. Existing technologies do not abstract any portion of the problem, and abstraction can greatly reduce complexity and speed-up proofs. In other words, embodiments of the present disclosure may allow the EDA application to bring RTL logic into the verification task only as needed. Embodiments included herein may automatically process proof results from inter-instance paths to determine if data propagation between the original source and destination points can never happen. This may add to the flow automation and, as such, the user does not need to make sense out of multiple inter-instance paths proof results manually. If the hierarchical proof cannot determine the original data propagation check, the process may be configured to report instances that are known to be able to propagate data, and instances that cannot propagate data between source and destination points. Accordingly, the user may use this information to further simplify setup. For example, black-box instances that are known to not be able to be part of a functional path between source and destination.

In some embodiments, the present disclosure may be configured to automatically check paths around black-boxes. In this way, embodiments included herein may automatically create, prove and process results from inter-black-box paths to return which black-box are safe (e.g., do not hide a functional path) and which black-boxes are unsafe (e.g., can hide functional path). This may assist the end user by automatically checking all paths and processing results to generate a summarized report.

In some embodiments, the logic inside instances may be abstracted. The proof process may be iterative and may automatically explore lower level instances and associated inter/intra-instance paths as needed. Embodiments included herein may automatically check data propagation around actual design black-boxes to determine which ones are safe or unsafe. In other words, the black-box may be guaranteed to not hide a functional path or the black-box may hide a functional path.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for iterative, hierarchical electronic design verification comprising:

identifying, using at least one processor, a plurality of first level electronic design instances along an electronic design path from a source to a destination during an electronic design verification process, wherein each first level electronic design instance is positioned along the electronic design path between the source and the destination and include one or more inputs configured to receive data from a source side of the electronic design path and one or more outputs configured to propagate data to a destination side of the electronic design path;

analyzing, using the at least one processor, inter-instance path information associated with the plurality of first level electronic design instances included in the electronic design path from source to destination, wherein analyzing includes checking data propagation on one or more inter-instance paths between the plurality of first level electronic design instances, wherein checking data propagation on the one or more inter-instance paths between the plurality of first level electronic design instances includes checking whether data can propagate from the source side to any input of each first level electronic design instance and whether data can propagate from any output of each first level electronic design instance to the destination side;

determining, based upon, at least in part, inter-instance path information that data is unable to propagate from the source to the destination and that no functional path exists along the inter-instance path through one or more first level electronic design instances, thus defining one or more unreachable first level electronic design instances;

determining, based upon, at least in part, inter-instance path information that data is able to propagate from the source to the destination through one or more first level electronic design instances, thus defining one or more reachable first level electronic design instances;

removing the one or more unreachable first level electronic design instances from further analysis of the electronic design path from the source to the destination;

identifying, using the at least one processor, a plurality of second level electronic design instances within the one or more reachable first level electronic design instances;

analyzing, using the at least one processor, inter-instance path information associated with the plurality of second level electronic design instances included in the electronic design path from source to destination, wherein analyzing includes analyzing logic information included within the plurality of second level electronic design instances; and determining, based upon, at least in part, inter-instance path information that data is able to propagate from the source to the destination, using the at least one processor.

2. The computer-implemented method of claim 1, wherein determining includes reporting a particular electronic design instance that allows the data to propagate.

3. The computer-implemented method of claim 1, wherein determining includes reporting a particular electronic design instance that does not allow the data to propagate.

4. The computer-implemented method of claim 1, further comprising:

attempting to prove the validity of a subportion of the electronic design path.

5. The computer-implemented method of claim 1, further comprising:

automatically determining one or more electronic design instances that do not hide a functional path or one or more electronic design instances that do hide a functional path.

6. The computer-implemented method of claim 5, further comprising:

generating a report including the one or more electronic design instances.

7. The computer-implemented method of claim 1, further comprising:

abstracting logic included within the plurality of higher level electronic design instances.

8. The computer-implemented method of claim 1, further comprising:

analyzing data propagation associated with one or more design black-boxes.

9. The computer-implemented method of claim 1, further comprising:
determining, for each inter-instance path, whether no functional path exists between a first instance and a second instance, that it is undetermined whether a functional path exists between the first instance and the second instance, or that a functional path does exist between the first instance and the second instance.

10. A computer-readable storage medium for iterative, hierarchical electronic design verification, the computer-readable storage medium having stored thereon instructions that when executed by a machine result in one or more operations, the operations comprising:
identifying, using a processor, one or more first level instances along an electronic design path during an electronic design verification process, wherein each first level electronic design instance is positioned along the electronic design path between a source and a destination and include one or more inputs configured to receive data from a source side of the electronic design path and one or more outputs configured to propagate data to a destination side of the electronic design path;
analyzing inter-instance path information associated with the one or more first level instances included in the electronic design path, wherein analyzing includes checking data propagation along one or more inter-instance paths between one or more design black-boxes and processing exclusively instance port signal information between the source and the destination, wherein checking data propagation on the one or more inter-instance paths between the plurality of first level electronic design instances includes checking whether data can propagate from the source side to any input of each first level electronic design instance and whether data can propagate from any output of each first level electronic design instance to the destination side;
determining, based upon, at least in part, inter-instance path information that data is unable to propagate from the source to the destination along a specified portion of the electronic design path through one or more first level electronic design instances, thus defining one or more unreachable first level electronic design instances;
determining, based upon, at least in part, inter-instance path information that data is able to propagate from the source to the destination through one or more first level electronic design instances, thus defining one or more reachable first level electronic design instances; and
removing the one or more unreachable first level electronic design instances from further analysis of the electronic design path from the source to the destination.

11. The computer-readable storage medium of claim 10, wherein determining includes reporting a particular instance that allows the data to propagate.

12. The computer-readable storage medium of claim 10, wherein determining includes reporting a particular instance that does not allow the data to propagate.

13. The computer-readable storage medium of claim 10, further comprising:
attempting to prove the validity of a subportion of the electronic design path.

14. The computer-readable storage medium of claim 10, further comprising:

automatically determining one or more instances that do not hide a functional path or one or more instances that do hide a functional path.

15. The computer-readable storage medium of claim 14, further comprising:
generating a report including the one or more instances.

16. The computer-readable storage medium of claim 10, further comprising:
abstracting logic included within the plurality of first level instances.

17. A computer-implemented method for iterative, hierarchical electronic design verification comprising:
identifying, using at least one processor, a plurality of first level electronic design instances along an electronic design path from a source to a destination during an electronic design verification process, wherein each first level electronic design instance is positioned along the electronic design path between the source and the destination and include one or more inputs configured to receive data from a source side of the electronic design path and one or more outputs configured to propagate data to a destination side of the electronic design path;
analyzing, using the at least one processor, inter-instance path information associated with the plurality of first level electronic design instances included in the electronic design path from source to destination wherein analyzing the inter-instance information includes checking whether data can propagate from the source side to any input of each first level electronic design instance and whether data can propagate from any output of each first level electronic design instance to the destination side;
determining, based upon, at least in part, inter-instance path information that data is unable to propagate from the source to the destination and that no functional path exists through one or more first level electronic design instances, thus defining one or more unreachable first level electronic design instances;
determining, based upon, at least in part, inter-instance path information that data is able to propagate from the source to the destination through one or more first level electronic design instances, thus defining one or more reachable first level electronic design instances;
in response to defining the one or more unreachable first level electronic design instances:
removing the one or more unreachable first level electronic design instances from further analysis of the electronic design path from the source to the destination;
identifying, using the at least one processor, a plurality of second level electronic design instances within the one or more reachable first level electronic design instances without identifying second level electronic design instances from the one or more unreachable first level electronic design instances;
analyzing, using the at least one processor, inter-instance path information associated with the plurality of second level electronic design instances included in the electronic design path from source to destination without analyzing intra-instance path information associated with the plurality of second level electronic design instances; and
determining, based upon, at least in part, inter-instance path information associated with the plurality of second level electronic design instances that data is able to propagate from the source to the destination, using the at least one processor.

* * * * *